US008242525B2

(12) United States Patent
Tian et al.

(10) Patent No.: US 8,242,525 B2
(45) Date of Patent: Aug. 14, 2012

(54) SILICATE-BASED PHOSPHORS AND LED LIGHTING DEVICES USING THE SAME

(75) Inventors: Yongchi Tian, Princeton Junction, NJ (US); Perry Niel Yocom, Washington Crossing, PA (US); Olga Zakharov, Princeton, NJ (US); Alison Sides, Knoxville, TN (US); Alan C. Thomas, Gilbert, AZ (US)

(73) Assignee: Lightscape Materials, Inc., Princeton, NJ (US)

( * ) Notice: Subject to any disclaimer, the term of this patent is extended or adjusted under 35 U.S.C. 154(b) by 408 days.

(21) Appl. No.: 12/469,522

(22) Filed: May 20, 2009

(65) Prior Publication Data
US 2009/0289271 A1 Nov. 26, 2009

Related U.S. Application Data

(60) Provisional application No. 61/054,667, filed on May 20, 2008, provisional application No. 61/075,128, filed on Jun. 24, 2008.

(51) Int. Cl.
*H01L 33/00* (2010.01)
(52) U.S. Cl. ............... 257/98; 257/13; 257/79; 257/88; 257/103; 313/485; 313/486; 313/496; 313/503; 313/512
(58) Field of Classification Search ........................ None
See application file for complete search history.

(56) References Cited

U.S. PATENT DOCUMENTS

| 2,297,107 | A | 9/1942 | McKeag et al. |
| 5,998,925 | A | 12/1999 | Shimizu et al. |
| 6,066,861 | A | 5/2000 | Hohn et al. |
| 6,084,250 | A | 7/2000 | Justel et al. |
| 6,351,069 | B1 | 2/2002 | Lowery et al. |
| 6,649,946 | B2 | 11/2003 | Bogner et al. |
| 6,762,551 | B2 * | 7/2004 | Shiiki et al. ............... 313/503 |
| 6,809,347 | B2 | 10/2004 | Tasch et al. |
| 6,812,500 | B2 | 11/2004 | Reeh et al. |
| 6,832,928 | B2 | 12/2004 | Suzuki et al. |
| 6,936,857 | B2 | 8/2005 | Doxsee et al. |
| 6,939,481 | B2 | 9/2005 | Srivastava et al. |
| 6,943,380 | B2 | 9/2005 | Ota et al. |
| 6,982,045 | B2 | 1/2006 | Menkara et al. |
| 7,023,019 | B2 | 4/2006 | Maeda et al. |
| 7,138,660 | B2 | 11/2006 | Ota et al. |

(Continued)

FOREIGN PATENT DOCUMENTS

| EP | 0552513 | 7/1993 |
| WO | 2004067677 | 8/2004 |

OTHER PUBLICATIONS

Nichia Corp., Specifications for Nichia Chip Type Blue LED Model: NSCB100AT, http://www.dotlight.de/shop/product_info.php/products_id/433 (last visited May 5, 2008).

(Continued)

*Primary Examiner* — Kyoung Lee
(74) *Attorney, Agent, or Firm* — Lowenstein Sandler PC

(57) ABSTRACT

Disclosed herein is a group of phosphors of the formula
$$M_2(SiO_4)_{1-x-y-z}(TiO_4)_x(ZrO_4)_y(HfO_4)_z:A,S$$
and light emitting devices which utilize these phosphors.

19 Claims, 8 Drawing Sheets

U.S. PATENT DOCUMENTS

| | | | |
|---|---|---|---|
| 7,157,746 B2 | 1/2007 | Ota et al. | |
| 7,210,977 B2 | 5/2007 | Ouderkirk | |
| 7,227,190 B2 | 6/2007 | Yasukawa et al. | |
| 7,267,787 B2 | 9/2007 | Dong et al. | |
| 7,276,183 B2 | 10/2007 | Tian | |
| 7,294,956 B2 | 11/2007 | Maeda et al. | |
| 7,297,293 B2 | 11/2007 | Tamaki et al. | |
| 7,311,858 B2 | 12/2007 | Wang et al. | |
| 2004/0145289 A1 | 7/2004 | Ouderkirk et al. | |
| 2006/0197439 A1* | 9/2006 | Sakane et al. | 313/503 |
| 2006/0214175 A1 | 9/2006 | Tian et al. | |
| 2007/0046176 A1 | 3/2007 | Bukesov et al. | |
| 2007/0125982 A1 | 6/2007 | Tian et al. | |
| 2007/0259206 A1* | 11/2007 | Oshio | 428/690 |
| 2008/0073616 A1 | 3/2008 | Dong et al. | |
| 2008/0128679 A1 | 6/2008 | Tian et al. | |

OTHER PUBLICATIONS

Shuji Nakamura et al, The Blue Laser Diode, pp. 230-235 (2d ed. 2000).

Thomas L. Barry, Flourescence of Eu2+Activated Phases in Binary Alkaline Earth Orthosilicate Systems, Solid State Sci., vol. 115(11), pp. 1181-1184 (Nov. 1968).

Shuji Nakamura et al, Characteristics of InGaN Multi-Quantum-Well-Structure Laser Diodes, Appl. Phy. Lett., vol. 68 (23), pp. 3269-3271 (1996).

S.H.M. Poort et al, Optical properties of Eu2+-activated orthosilicates and orthophosphates, J. Alloys and Compounds, vol. 260, pp. 93-97 (1997).

International Search Report for PCT/US2009/44725.

* cited by examiner

SILICATE-BASED PHOSPHORS AND LED LIGHTING DEVICES USING THE SAME

CLAIM OF PRIORITY

This application claims priority to U.S. Provisional Application No. 61/054,667, filed May 20, 2008, and U.S. Provisional Application No. 61/075,128, filed Jun. 24, 2008, the disclosures of which are hereby incorporated by reference in their entireties.

STATEMENT REGARDING REFERENCES

All patents, publications, and non-patent references referred to herein shall be considered incorporated by reference into this application in their entireties.

BACKGROUND OF THE INVENTION

Creating sources of white light is the ultimate goal of solid state lighting technology. The largest market for LED-based lighting devices is the replacement of conventional incandescent and probably even fluorescent lamps. Practical white LED-based lighting devices became feasible only after the development of high brightness AlInGaN-based blue or near UV LEDs. Excited with short wavelength LEDs, white light emitting devices that exploit the mixture of two or three colors are being developed. In view of potential applications, the designs of these solid state light emitters aim at a combination of high efficiency and high color rendering.

There are basically two ways to produce white light emitting devices. The first approach is to mix light of different colors emitted by different chips. The other way is to downconvert the emission from a blue or UV LED to a longer wavelength light using phosphors. Where a blue LED is used, a part of the primary emission is used as a component of the white light emitting device as well. The number of phosphors involved in such a phosphor conversion ("PC") LED may vary depending on the device characteristics required.

A straightforward way to devise a white light emitting device is to utilize an AlInGaN LED chip that emits blue light and a phosphor that emits in the yellow region. The blue chip is mounted in a built-in reflector cup and coated with a phosphor layer which is a mixture of encapsulant resin and phosphor powder. The entire structure is embedded in a transparent resin. A part of the blue light is absorbed in the phosphor layer and down converted to yellow light. The rest of the blue emission escapes into the transparent resin. A variety of phosphors for the down conversion of AlInGaN LED emission were considered. However, the most widely used phosphor is yttrium aluminum garnet ("YAG") doped with trivalent cerium ($Ce^+$). This phosphor emits a yellow light. A white light emitting device can be made by combining a blue emitting chip with this YAG phosphor.

Light emitting devices can also be constructed with metal silicate phosphors. There are several patents or patent applications that describe metal silicate phosphors and their application onto LED chips to make lighting emitting devices. WO 2004/067677 describes a strontium silicate-based phosphor ($Sr_2SiO_4$:$Eu^{2+}$) combined with a blue LED chip to make a lamp. U.S. Pat. Nos. 7,294,956 and 7,023,019 describe a family of alkaline earth metal orthosilicate doped with divalent europium ($Sr_{1-a1-b1-x}Ba_{a1}Ca_{b1}Eu_x)SiO_4$ in orthorhombic crystal structure, and their use in combination with LED chip to construct lighting devices. U.S. Pat. No. 6,982,045 describes a similar formulation, $Sr_xBa_yCa_zSiO_4$:Eu, and their application to LED devices. U.S. Pat. No. 7,267,787 describes a group of phosphor formula expressed by $A_2SiO_4$:$Eu^{2+}$F where A is at least one of a divalent metal selected from the group consisting of Sr, Ca, Ba, Mg, Zn, and Cd, and wherein the fluorine dopant substitutes for oxygen and also described the utilization of the phosphors in LED devices. In a later patent, U.S. Pat. No. 7,311,858, and U.S. publication No. 2008-0073616, the formula $A_2SiO_4$:$Eu^{2+}$D is described, where A is at least one of a divalent metal selected from the group consisting of Sr, Ca, Ba, Mg, Zn, and Cd; and D is a dopant selected from the group consisting of F, Cl, Br, I, P, S and N. In one embodiment described therein, the phosphor has the formula $(Sr_{1-x-y}Ba_xM_y)_2SiO_4$:$Eu^{2+}$F (where M is one of Ca, Mg, Zn, or Cd in an amount ranging from 0<y<0.5. A series of patents are granted to Toyoda Gosei, U.S. Pat. Nos. 7,157,746, 7,138,660, 6,943,380 and 7,227,190 in which the orthosilicate-based phosphor formulations are described for LED lighting applications. The general formula for the phosphors described therein is expressed by $(Sr_{(1-x-y)}Ba_xCa_y)_2(Si_{(1-\alpha-\beta-\gamma-\delta)}P_\alpha Al_\beta B_\gamma Ge_\delta)O_4$:$Eu^{2+}$ where 0<x 0.8, 0y<0.8, 0<x+y<1, 0 α, β, γ<0.25, δ<0.5, 0 α+β+γ+<1.

There continues to be a need in the art for phosphors with enhanced emission efficiencies and improved stabilities that can be utilized in lighting technology. This need has been addressed by the present invention which is directed to a family of mixed metal silicate zirconate titanate hafnate phosphor formulations, doped with one or more metal ions, that can be excited with blue or near UV light and emit a yellow light.

All references described herein are incorporated by reference in their entireties for all purposes.

SUMMARY OF THE INVENTION

The present invention is directed to a group of phosphors of the formula

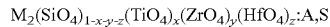

$M_2(SiO_4)_{1-x-y-z}(TiO_4)_x(ZrO_4)_y(HfO_4)_z$:A,S where M represents one or more divalent metal ions selected from the group of $Mg^{2+}$, $Ca^{2+}$, $Sr^{2+}$, $Ba^{2+}$, $Zn^{2+}$, $Cd^{2+}$; A represents one or more activators selected from the group including divalent metal ions $Mn^{2+}$, $Sn^{2+}$, $Pb^{2+}$, $Eu^{2+}$ and $Yb^{2+}$; and S represents one or more co-activators selected from the group consisting of trivalent metal or rare earth metal ions including $Bi^{3+}$, $Al^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ and $Lu^{3+}$, and monovalent metal ions including $Li^+$, $Na^+$, $K^+$, $Rb^+$, $Cu^+$, $Ag^+$ and halogen ions $F^-$, $Cl^-$, $Br^-$ and $I^-$, and 0<x, y, z<1; x+y+z<1.

In certain embodiments, the present invention is directed to a light emitting device comprising a light emitting diode which emits light having a first luminescence spectrum and a phosphor which absorbs at least a portion of light of the first luminescence spectrum and emits light having a second luminescence spectrum which is different than the first luminescence spectrum, wherein the phosphor is a phosphor of formula I:

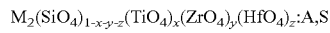

$M_2(SiO_4)_{1-x-y-z}(TiO_4)_x(ZrO_4)_y(HfO_4)_z$:A,S wherein M is one or more divalent metal ions; A is one or more activators; S is one or more co-activators; and 0<x, y, z<1; x+y+z<1.

In certain embodiments, the present invention is further directed to a phosphor of formula I:

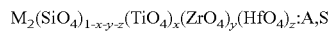

$M_2(SiO_4)_{1-x-y-z}(TiO_4)_x(ZrO_4)_y(HfO_4)_z$:A,S wherein M is one or more divalent metal ions; A is one or more activators; S is one or more co-activators; and 0<x, y, z<1; x+y+z<1.

In preferred embodiments, M is selected from the group consisting of $Mg^{2+}$, $Ca^{2+}$, $Sr^{2+}$, $Ba^{2+}$, $Zn^{2+}$, $Cd^{2+}$ and combinations thereof.

In preferred embodiments, A is selected from the group consisting of divalent rare earth metal ions, trivalent metal ions and mixtures thereof. In even more preferred embodiments, A is a divalent rare earth metal ion selected from the group consisting of $Eu^{2+}$ and $Yb^{2+}$ and mixtures thereof, or A is a trivalent metal ion selected from the group consisting of $Bi^{3+}$, $Al^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ and $Lu^{3+}$ and mixtures thereof.

In preferred embodiments, S is selected from the group consisting of monovalent metal ion, halogen ions and mixtures thereof. In more preferred embodiments, S is a monovalent metal ion selected from the group consisting of $Li^+$, $Na^+$, $K^+$, $Rb^+$, $Cu^+$, $Ag^+$ and mixtures thereof, or S is a halogen ion selected from the group consisting of $F^-$, $Cl^-$, $Br^-$, $I^-$ and mixtures thereof. In further preferred embodiments, S is one or more trivalent metal or rare earth metal ions, $Bi^{3+}$, $Al^{3+}$, $Ce^{3+}$, $Pr^{3+}$, $Nd^{3+}$, $S^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ and $Lu^{3+}$.

In yet other embodiments, the phosphor of the present invention has a formula selected from the group consisting of:
a. $(Ca_xSr_{1-x})_2(SiO_4):Ce^{3+}, Lu^{2+}, H^-$, wherein $H^-$ is one or more halogen ions;
b. $(Ca_xSr_{1-x})_2(SiO_4):Eu^{2+}, Pr^{3+}, A$, wherein A is one or more monovalent ions;
c. $(Ca_xSr_{1-x})_2(SiO_4):Eu^{2+}, Dy^{3+}, H^-$, wherein $H^-$ is one or more halogen ions;
d. $(Ca_xSr_{1-x})_2(SiO_4):Eu^{2+}, Yb^{2+}, H^-$, wherein $H^-$ is one or more halogen ions;
e. $(Ca_xSr_{1-x})_2(SiO_4)_{1-y}(ZrO_4)_y:Eu^{2+}, H^-$, wherein $H^-$ is one or more halogen ions; and
f. $(Ca_xSr_{1-x})_2(SiO_4)_{1-z}(HfO_4)_z:Eu^{2+}, H^-$, wherein $H^-$ is one or more halogen ions;
wherein $0<x, y, z<1$ and $x+y+z<1$.

In yet other embodiment, the phosphor has a formula of $(Ca_xSr_{1-x})_2(SiO_4):Ce^{3+}, Eu^{2+}, H^-$, wherein $H^-$ is one or more halogen ions and wherein $0<x<1$.

In still other embodiments, the phosphor has a formula selected from the group consisting of:
g. $(Ca_xSr_{1-x})_2(SiO_4):Ce^{3+}, Eu^{2+}, Li^+$;
h. $(Ca_xSr_{1-x})_2(SiO_4):Ce^{3+}, Eu^{2+}, Cl^-$;
i. $(Ca_xSr_{1-x})_2(SiO_4):Ce^{3+}, Eu^{2+}, Br^-$;
j. $(Ca_xSr_{1-x})_2(SiO_4):Ce^+, Eu^{2+}, I^-$;
k. $(Ca_xSr_{1-x})_2(SiO_4):Ce^{3+}, Eu^{2+}, Cl^-, I^-$;
l. $(Ca_xSr_{1-x})_2(SiO_4):Ce^+, Eu^{2+}, Cl^-, Br^-$; and
m. $(Ca_xSr_{1-x})_2(SiO_4):Ce^{3+}, Eu^{2+}, Br^-, I^-$;
wherein $0<x<1$.

In preferred embodiments, the phosphor has a formula of $(Ca_xSr_{1-x})_2(SiO_4):Eu^{2+}, Pr^{3+}, A$, wherein A is one or more monovalent ions and wherein $0<x<1$.

In other preferred embodiments, the phosphor has a formula selected from the group consisting of:
n. $(Ca_xSr_{1-x})_2(SiO_4):Eu^{2+}, Pr^{3+}, Li^+$;
o. $(Ca_xSr_{1-x})_2(SiO_4):Eu^{2+}, Pr^{3+}, Cl^-$;
p. $(Ca_xSr_{1-x})_2(SiO_4):Eu^{2+}, Pr^{3+}, Br^-$;
q. $(Ca_xSr_{1-x})_2(SiO_4):Eu^{2+}, Pr^{3+}, I^-$;
r. $(Ca_xSr_{1-x})_2(SiO_4):Eu^{2+}, Pr^{3+}, Cl^-, I^-$;
s. $(Ca_xSr_{1-x})_2(SiO_4):Eu^{2+}, Pr^{3+}, Cl^-, Br^-$; and
t. $(Ca_xSr_{1-x})_2(SiO_4):Eu^{2+}, Pr^{3+}, Br^-, I^-$;
wherein $0<x<1$.

In other preferred embodiments, the phosphor has a formula selected from the group consisting of:
u. $(Ca_xSr_{1-x})_2(SiO_4):Eu^{2+}, Dy^{3+}, Li^+$;
v. $(Ca_xSr_{1-x})_2(SiO_4):Eu^{2+}, Dy^{3+}, Cl^-$;
w. $(Ca_xSr_{1-x})_2(SiO_4):Eu^{2+}, Dy^{3+}, Br^-$;
x. $(Ca_xSr_{1-x})_2(SiO_4):Eu^{2+}, Dy^{3+}, I^-$;
y. $(Ca_xSr_{1-x})_2(SiO_4):Eu^{2+}, Dy^{3+}, Cl^-, I^-$;
z. $(Ca_xSr_{1-x})_2(SiO_4):Eu^{2+}, Dy^{3+}, Cl^-, Br^-$; and
aa. $(Ca_xSr_{1-x})_2(SiO_4):Eu^{2+}, Dy^{3+}, Br^-, I^-$;
wherein $0<x<1$.

In other preferred embodiments, the phosphor has a formula selected from the group consisting of:
bb. $(Ca_xSr_{1-x})_2(SiO_4):Eu^{2+}, Yb^{2+}, Li^+$
cc. $(Ca_xSr_{1-x})_2(SiO_4):Eu^{2+}, Yb^{2+}, Cl^-$;
dd. $(Ca_xSr_{1-x})_2(SiO_4):Eu^{2+}, Yb^{2+}, Br-$;
ee. $(Ca_xSr_{1-x})_2(SiO_4):Eu^{2+}, Yb^{2+}, I^-$;
ff. $(Ca_xSr_{1-x})_2(SiO_4):Eu^{2+}, Yb^{2+}, Cl^-, 1$;
gg. $(Ca_xSr_{1-x})_2(SiO_4):Eu^{2+}, Yb^{2+}, Cl^-, Br^-$; and
hh. $(Ca_xSr_{1-x})_2(SiO_4):Eu^{2+}, Yb^{2+}, Br^-, I^-$;
wherein $0<x<1$.

In other preferred embodiments, the phosphor has a formula selected from the group consisting of:
ii. $(Ca_xSr_{1-x})_2(SiO_4)_{1-y}(ZrO_4)_y:Eu^{2+}, Cl^-$;
jj. $(Ca_xSr_{1-x})_2(SiO_4)_{1-y}(ZrO_4)_y:Eu^{2+}, Cl^-, Br^-$;
kk. $(Ca_xSr_{1-x})_2(SiO_4)_{1-y}(ZrO_4)_y:Eu^{2+}, Br^-, I^-$; and
ll. $(Ca_xSr_{1-x})_2(SiO_4)_{1-y}(ZrO_4)_y:Eu^{2+}, Cl^-, I^-$;
wherein $0<x<1$ and $0<y<1$.

In other preferred embodiments, the phosphor has a formula selected from the group consisting of:
mm. $(Ca_xSr_{1-x})_2(SiO_4)_{1-y}(HfO_4)_y:Eu^{2+}, Cl^-$;
nn. $(Ca_xSr_{1-x})_2(SiO_4)_{1-y}(HfO_4)_y:Eu^{2+}, Cl^-, Br^-$;
oo. $(Ca_xSr_{1-x})_2(SiO_4)_{1-y}(HfO_4)_y:Eu^{2+}, Br^-, I^-$; and
pp. $(Ca_xSr_{1-x})_2(SiO_4)_{1-y}(HfO_4)_y:Eu^{2+}, Cl^-, I^-$;
wherein $0<x<1$ and $0<y<1$.

In yet other embodiments, the phosphor has a band emission with its bandwidth (FWHH) greater than about 100 nm.

In other embodiments, the phosphor emits light having an emission spectrum with wavelengths that range from about 400 nm to about 800 nm.

In embodiments directed to a light emitting device, the light emitting diode preferably emits light having an emission spectrum with wavelengths that range from about 200 nm to about 600 nm.

In yet other embodiments, each phosphor grain or particle is encapsulated with a coating, preferably with a thickness of from about 0.005 microns to about 3.0 microns, and in preferred embodiments, the coating comprises at least one layer which is an oxide. In more preferred embodiments, the oxide is selected from the group consisting of titanium oxide, aluminum oxide, zirconium oxide, tin oxide, boron oxide, silicon oxide, zinc oxide, germanium oxide, tantalum oxide, niobium oxide, hafnium oxide, gallium oxide, aluminum silicate and combinations thereof.

In yet other embodiments, the coating comprises at least one layer which contains a hydroxide. In more preferred embodiments, the hydroxide is selected from the group consisting of titanium hydroxide, aluminum hydroxide, zirconium hydroxide, tin hydroxide, boron hydroxide, silicon hydroxide, zinc hydroxide, germanium hydroxide, tantalum hydroxide, niobium hydroxide, hafnium hydroxide, gallium hydroxide and combinations thereof.

In yet other embodiments, the coating comprises at least one layer which contains an oxyhalide. In more preferred embodiments, the oxyhalide is selected from the group consisting of oxychloride, oxybromide and oxyiodide of titanium, aluminum, zirconium, tin, boron, silicon, zinc, germanium, tantalum, niobium, hafnium, gallium and combinations thereof.

In yet other embodiments, the coating comprises at least one layer which is product of hydrolysis of metal or semiconductor alkoxide, metal alkyl, or metal or semiconductor tetrachloride. Such a product is typically a mixture of metal or semiconductor oxide, hydroxide, oxyhalide and anionic halide.

In most preferred embodiments, the light output produced by the light emitting devices described herein is white light.

DEFINITIONS

As used herein, "activator" refers to the atomic or ionic species that emits light with the support of the host crystal. The activator or may be doped in the host crystal in a very small amount, as further described herein.

As used herein, "co-activator" refers to an additional activator in the same host crystal. As used herein, "dopant" refers to an atomic or ionic species that is doped in a host crystal.

As used herein, "metal alkyl" refers to a molecule having metal linking with one or more alkyl groups comprising at least one C1 to C16 straight or branched moiety, such as, methyl, diethyl, propyl, isopropyl, butyl, tert-butyl, pentyl, hexyl, octyl, nonyl and decyl.

As used herein, "sensitizer" refers to an atomic or ionic dopant that absorbs radiation energy and subsequently transfers the energy to a luminescence activator.

As used herein, a "coating" refers to a covering or outside layer(s) that: (a) comprises at least one product of hydrolysis of metal or semiconductor alkoxides, metal alkyl, or metal or semiconductor tetrachloride (e.g., products containing oxide, hydroxide, oxychloride and chlorine anion), and (b) is sufficiently complete so as to provide relative protection against water. Such coatings can contain other elements and compounds, such as those originating in the coating precursor (i.e., antecedent or predecessor) materials or phosphor particles, or other species formed during the coating application process, e.g. species formed during hydrolysis. In certain embodiments, the coating lacks optically distinguishable embedded particles.

As used herein, "particle" refers to an individual crystal of phosphor.

As used herein, "grain" refers to an agglomeration, aggregation, polycrystalline or polymorph of phosphor particles, where the particles are not easily separated as compared to phosphor particles of a powder.

As used herein, the term "phosphor" refers to a phosphor in any appropriate form, such as a phosphor particle, a phosphor grain, or phosphor powder comprised of phosphor particles, grains, or a combination thereof.

As used herein, "light source" refers to a Group III-V semiconductor quantum well-based light emitting diode or a phosphor other than the phosphor of a light emitting device of the present invention.

Temperatures described herein for processes involving a substantial gas phase are of the oven or other reaction vessel in question, not of the reactants per se.

"White light," as used herein, is light of certain chromaticity coordinate values (e.g., Commission Internationale de l'Éclairage (CIE)), which are well-known in the art.

Unless defined otherwise, all technical and scientific terms used herein have the same meaning as commonly understood by one of ordinary skill in the art to which this invention belongs. All technical and scientific terms used herein have the same meaning when used. It must be noted that, as used herein and in the appended claims, the singular forms "a", "and", and "the" include plural references unless the context clearly dictates otherwise.

In the description of phosphors, a conventional notation is used, wherein the chemical formula for the host crystal is given first, followed by a colon and the formula for the activator(s) and co-activator(s).

DETAILED DESCRIPTION

Figure 1:
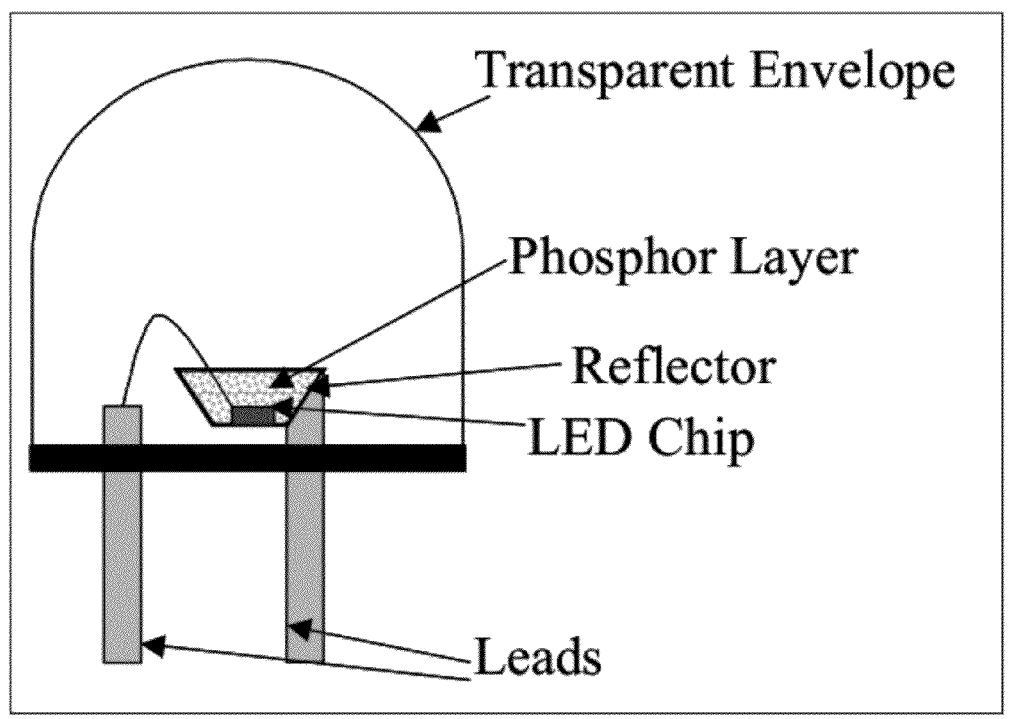
FIG. 1 depicts an embodiment of a light emitting device of the present invention.

In the present invention, a family of phosphors is disclosed whose host materials are metal silicates containing titanate, zirconate and/or hafnate units, and whose luminescent activators are one or more metal ions. The phosphors can be excited by a light of wavelength ranging from about 200 to about 550 nm and emit a visible light of wavelengths ranging from about 400 to about 750 nm. The formulation of the phosphors are represented by

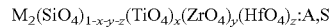

$$M_2(SiO_4)_{1-x-y-z}(TiO_4)_x(ZrO_4)_y(HfO_4)_z:A,S$$

wherein M is one or more divalent metal ions; A is one or more activators; S is one or more co-activators; and 0<x, y, z<1; x+y+z<1.

In certain embodiments, M can be one or more divalent metal ions which include, but are not limited to $Mg^{2+}$, $Ca^{2+}$, $Sr^{2+}$, $Ba^{2+}$, $Zn^{2+}$, $Cd^{2+}$.

In other embodiments, A can be one or more activators which can be divalent rare earth metal ions which include but are not limited to $Eu^{2+}$, $Yb^{2+}$, and trivalent metal ions, which include but are not limited to $Bi^{3+}$, $Al^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ and $Lu^{3+}$.

In further embodiments, S can be one or more co-activators which can be monovalent metal ions which include but are not limited to $Li^+$, $Na^+$, $K^+$, $Rb^+$, $Cu^+$, $Ag^+$ and halogen ions which include but are not limited to $F^-$, $Cl^-$, $Br^-$ and $I^-$.

The phosphors disclosed herein can also be activated by other rare earth metal ions. The phosphors are pumped by light, e.g., in a wavelength range of about 200 nm to about 600 nm, preferably in a wavelength of about 350-450 nm, while emitting a visible light wavelength range, e.g., from about 400 nm to about 800 nm, preferably in the range of about 500 to 600 nm. The phosphors can be combined with a light emitting diode ("LED") chip to produce light of color covering a large color gamut, including the chromaticity area of white colors.

The phosphors disclosed herein may be incorporated into a light emitting device, e.g., by applying the phosphor to an LED.

In preferred embodiments of the invention, the phosphor has a formula selected from the group consisting of:
- $(Ca_xSr_{1-x})_2(SiO_4):Ce^{3+}, Eu^{2+}, H^-$, wherein $H^-$ is one or more halogen ions;
- $(Ca_xSr_{1-x})_2(SiO_4):Eu^{2+}, Pr^{3+}, A$, wherein A is one or more monovalent ions;
- $(Ca_xSr_{1-x})_2(SiO_4):Eu^{2+}, Dy^{3+}, H^-$, wherein $H^-$ is one or more halogen ions;
- $(Ca_xSr_{1-x})_2(SiO_4):Eu^{2+}, Yb^{2+}, H^-$, wherein $H^-$ is one or more halogen ions;
- $(Ca_xSr_{1-x})_2(SiO_4)_{1-x-y}(ZrO_4)_y:Eu^{2+}, H^-$, wherein $H^-$ is one or more halogen ions; and
- $(Ca_xSr_{1-x})_2(SiO_4)_{1-x-z}(HfO_4)_z:Eu^{2+}, H^-$, wherein $H^-$ is one or more halogen ions;
wherein $0<x, y, z<1$ and $x+y+z<1$.

In other preferred embodiments of the invention, the phosphor has a formula selected from the group consisting of:
- $(Ca_xSr_{1-x})_2(SiO_4):Ce^{3+}, Eu^{2+}, Li^+$;
- $(Ca_xSr_{1-x})_2(SiO_4):Ce^+, Lu^{2+}, Cl^-$;
- $(Ca_xSr_{1-x})_2(SiO_4):Ce^{3+}, Eu^{2+}, Br^-$;
- $(Ca_xSr_{1-x})_2(SiO_4):Ce^+, Eu^{2+}, I^-$;
- $(Ca_xSr_{1-x})_2(SiO_4):Ce^{3+}, Eu^{2+}, Cl^-, I^-$;
- $(Ca_xSr_{1-x})_2(SiO_4):Ce^+, Eu^{2+}, Cl^-, Br^-$; and
- $(Ca_xSr_{1-x})_2(SiO_4):Ce^+, Lu^{2+}, Br^-, I^-$;
wherein $0<x<1$.

In further preferred embodiments of the invention, the phosphor has a formula selected from the group consisting of:
- $(Ca_xSr_{1-x})_2(SiO_4):Eu^{2+}, Pr^{3+}, Li^+$;
- $(Ca_xSr_{1-x})_2(SiO_4):Eu^{2+}, Pr^{3+}, Cl^-$;
- $(Ca_xSr_{1-x})_2(SiO_4):Eu^{2+}, Pr^{3+}, Br^-$;
- $(Ca_xSr_{1-x})_2(SiO_4):Eu^{2+}, Pr^{3+}, I^-$;
- $(Ca_xSr_{1-x})_2(SiO_4):Eu^{2+}, Pr^{3+}, Cl^-, I^-$;
- $(Ca_xSr_{1-x})_2(SiO_4):Eu^{2+}, Pr^{3+}, Cl^-, Br^-$; and
- $(Ca_xSr_{1-x})_2(SiO_4):Eu^{2+}, Pr^{3+}, Br^-, I^-$;
wherein $0<x<1$.

In certain embodiments, the phosphors of the present invention have a band emission with a FWHH greater than about 100 nm.

In other embodiments, the phosphors of the present invention emit light having an emission spectrum with wavelengths that range from about 400 nm to about 800 nm, preferably from about 450 to about 800.

In further embodiments wherein the phosphor is included in a light emitting device, the light emitting diode emits light having an emission spectrum with wavelengths that range from about 300 nm to about 500 nm, preferably from about 350 to 460 nm.

In preferred embodiments of the present invention, the formula of the phosphor is represented by formula I:

$$M_2(SiO_4)_{1-x-y-z}(TiO_4)_x(ZrO_4)_y(HfO_4)_z:A,S \quad (I)$$

where M represents one or more divalent metal ions selected from the group of $Mg^{2+}, Ca^{2+}, Sr^{2+}, Ba^{2+}, Zn^{2+}$ and $Cd^{2+}$; A represents one or more activators selected from the group including divalent metal ions $Mn^{2+}, Sn^{2+}, Pb^{2+}, Eu^{2+}$ and $Yb^{2+}$; S represents one or more co-activators selected from a group including trivalent rare earth metal ions, $Ce^{3+}, Pr^{3+}, Nd^{3+}, Sm^{3+}, Eu^{3+}, Gd^{3+}, Tb^{3+}, Dy^{3+}, Ho^{3+}, Er^{3+}, Tm^{3+}, Yb^{3+}$, 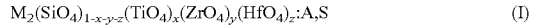 $Lu^{3+}$, and $Bi^{3+}, Al^{3+}$, and monovalent metal ions including $Li^+, Na^+, K^+, Rb^+, Cu^+, Ag^+$ and halogen ions $F^-, Cl^-, Br^-$ and $I^-$; and $0<x, y, z<1; x+y+z<1$. In formula (I), luminescence is activated by doping the host crystal with more than one activator ion as illustrated by the presence of A and S. The anion units titanate $[TiO_4]^{4-}$, zirconate $[ZrO_4]^{4-}$ and hafnate $[HfO_4]^{4-}$ confer additional advantages upon the host crystal, as further discussed below.

In certain embodiments, the mole percentage of activator cation A is about 0.001% to about 10%. In certain embodiments, the range of the mole percentage of A is from one of the following lower endpoints (inclusive or exclusive): about 0.001%, about 0.01%, about 0.02%, about 0.05%, about 0.1%, about 0.2%, about 0.5%, about 1%, about 2%, about 3%, about 4% and about 5% mole and from one of the following upper endpoints (inclusive or exclusive): about 0.01%, about 0.02%, about 0.05%, about 0.1%, about 0.2%, about 0.5%, about 1%, about 2%, about 3%, about 4%, about 5% and about 10% mole. For example, the range can be from about 0.01% to about 5% mole. It will be understood by those of ordinary skill in the art that A can in fact substitute for the primary (i.e., principal or main) metal components of the phosphor—nonetheless, the primary metal components, if recited in relative amounts, are recited normalized, as if the combined primary metals were present in formula amounts as would pertain absent A.

The crystal field of the activator(s) varies with the presence of different anions in the host crystal, e.g. $[SiO_4]^{4+}, [TiO_4]^{4-}, [ZrO_4]^{4-}$ and $[HfO_4]^{4-}$, and combinations thereof. Thus, a variety of excited states can be produced by the various embodiments of the present invention depending on which combinations of anions and activators are present. These variations in the crystal field of the activator(s) result in phosphor materials that emit light of various colors with varying emission bandwidths. Examples include the phosphors having zirconate and haffiate units as demonstrated in Examples 2 and 3.

An advantage of the present invention over the prior art is improved stability. The chemical and thermal stability of the host crystals containing one or more of $[SiO_4]^{4-}, [TiO_4]^{4-}, [ZrO_4]^{4-}$ and $[HfO_4]^{4-}$, and combinations thereof, are superior to most other metal silicate phosphors that lack anionic oxides. For example, zircon ($ZrSiO_4$) and sphene (CaTi$SiO_5$), are known to have superior chemical and thermal stability. The light emitting devices of the present invention which incorporate the phosphors of the present invention can thus be expected to have a longer life time and be more capable of withstanding harsh conditions, e.g. high temperatures and high humidity.

Another advantage of the present invention is that a variety of different color characteristics may be obtained by varying the activator(s) and co-activator(s). Doping with one or more activators, A, and one or more co-activators, S, can tailor the emission character of the emitted light in terms of emission wavelength and bandwidth. This is advantageous to lighting design in that it allows one to obtain desired color characteristics defined by color rendering index (CRI) chromaticity coordinates and correlated color temperature. The luminescence emission can be further enhanced by co-doping an ion with the activator, A, which serves a sensitizing role to the primary luminescence activator, leading to an enhanced emission. For example and without limitation, such an effect was found in phosphors having $Dy^{3+}$ as co-dopant. Further examples of the effects of varying the activators and co-activators are demonstrated in Table 1 below.

Another advantage of the present invention is that the phosphors described herein exhibit peak excitation at wavelengths less than 450 nm, allowing the use of light sources having lower wavelength emissions.

Yet another advantage of the present invention is that the phosphors described herein include one or more luminescent activator ions, as well as one or more host structure components selected from titanate $[TiO_4]^{4-}$, zirconate $[ZrO_4]^{4-}$, and hafnate $[HfO_4]^{4-}$ anions as part of the host crystal. Previous silicate based phosphors incorporated only one activator. Because the luminescent emission arises from the activator, phosphors with a single activator have a relatively narrow emission band (FWHH <100 nm). Phosphors of the present invention, on the other hand, have more than one activator and therefore have a broad band emission (FWHH >100 nm), as shown in Table 1. The sensitizer represented by S in the present phosphor formula either shifts the emission peak wavelength or enhances the emission efficiency, depending on the particular phosphor formula.

The phosphor or blend of phosphors of the formulations described herein may be applied to an LED chip that emits in the 300-500 nm wavelength domain to produce a light emitting device. Such a lighting device consists of at least an AlInGaN-based light emitting diode ("LED") that emits a primary light, and a layer of phosphor or phosphor blend that absorbs a part of the LED emission. The LED emission excites the phosphor layer and the phosphor layer converts the light into a light in a visible wavelength range.

Coatings

In certain embodiments of the present invention, the phosphors are coated. The benefits of the coating include the protection of the phosphor from degradation due to moisture, resulting in a longer-lasting and more durable phosphor.

Various techniques for applying the coating can be used, e.g., hydrolytic chemical deposition or a hydrolytic chemical vapor deposition. In some embodiments, the phosphors of the present invention are coated such that they lose little, if any, of their initial photoluminescence over lengthy periods when subjected to high temperature and high humidity conditions. In some embodiments, the coating maintains about 80% of a phosphor's original optical performance after exposure to about 85° C. and about 85% relative humidity for at least 16 hours. In other embodiments, the coating maintains about 80% of a phosphor's original optical performance after exposure to about 85° C. and about 85% relative humidity for at least 250 hours. In other embodiments, the coating maintains about 80% of a phosphor's original optical performance after exposure to about 85° C. and about 85% relative humidity for at least 500 hours. In other embodiments, the coating maintains about 80% of a phosphor's original optical performance after exposure to about 85° C. and about 85% relative humidity for at least 750 hours. In other embodiments, the coating maintains about 80% of a phosphor's original optical performance after exposure to about 85° C. and about 85% relative humidity for at least 1000 hours. In other embodiments, the coating maintains about 80% of a phosphor's original optical performance after exposure to about 85° C. and about 85% relative humidity for at least 1250 hours. In other embodiments, the coating maintains about 80% of a phosphor's original optical performance after exposure to about 85° C. and about 85% relative humidity for at least 1500 hours. In other embodiments, the coating maintains about 80% of a phosphor's original optical performance after exposure to about 85° C. and about 85% relative humidity for at least 1750 hours. In other embodiments, the coating maintains about 80% of a phosphor's original optical performance after exposure to about 85° C. and about 85% relative humidity for at least 2000 hours. In other embodiments, the coating maintains about 80% of a phosphor's original optical performance after exposure to about 85° C. and about 85% relative humidity for: between about 2000 and about 2100 hours; between about 2100 and about 2200 hours; between about 2200 and about 2300 hours; between about 2300 and about 2400 hours; or between about 2400 and about 2500 hours. Preferably, the coating provides a resistance against moist environments to maintain function of the coated phosphor for a period of time, e.g., of at least about 2000 hours or more.

In certain embodiments, the coating maintains at least about 90% percent of a phosphor's original optical performance after exposure to about 85° C. and about 85% relative humidity for at least 500 hours. In other embodiments, the coating maintains at least about 90% percent of a phosphor's original optical performance after exposure to about 85° C. and about 85% relative humidity for at least 1000 hours. In other embodiments, the coating maintains at least about 90% percent of a phosphor's original optical performance after exposure to about 85° C. and about 85% relative humidity for at least 1500 hours. In other embodiments, the coating maintains at least about 90% percent of a phosphor's original optical performance after exposure to about 85° C. and about 85% relative humidity for at least 1500 hours. In other embodiments, the coating maintains at least about 90% percent of a phosphor's original optical performance after exposure to about 85° C. and about 85% relative humidity for at least 2000 hours.

In certain embodiments, the coating maintains at least about 95% percent of a phosphor's original optical performance after exposure to about 85° C. and about 85% relative humidity for at least 500 hours. In other embodiments, the coating maintains at least about 95% percent of a phosphor's original optical performance after exposure to about 85° C. and about 85% relative humidity for at least 1000 hours. In other embodiments, the coating maintains at least about 95% percent of a phosphor's original optical performance after exposure to about 85° C. and about 85% relative humidity for at least 1500 hours. In other embodiments, the coating maintains at least about 95% percent of a phosphor's original optical performance after exposure to about 85° C. and about 85% relative humidity for at least 1500 hours. In other embodiments, the coating maintains at least about 95% percent of a phosphor's original optical performance after exposure to about 85° C. and about 85% relative humidity for at least 2000 hours.

In certain embodiments, the coating of the present invention can be a single layer of one type of oxide, for example, a titanium oxide; or, the coating can be multi-layer, i.e., comprising more than one layer or at least two layers, with each layer, comprising a different type of oxide or oxide combination. For example, and without limitation, one layer can comprise an aluminum oxide and one layer can comprise a silicon oxide.

The thickness of the coating (single or multiple layers) can be, e.g., from about 0.005 microns to about 3.0 microns.

Preferable components of the phosphor coatings include products of hydrolysis of metal or semiconductor alkoxides, metal alkyl, or metal or semiconductor tetrachloride, or mixtures thereof. Suitable products include but are not limited to titanium oxide, aluminum oxide, zirconium oxide, tin oxide, boron oxide, silicon oxide, zinc oxide, germanium oxide, tantalum oxide, niobium oxide, hafnium oxide, gallium oxide, aluminum silicate and combinations thereof.

In some embodiments, the coating comprises at least one layer which contains a hydroxide. In more preferred embodiments, the hydroxide is selected from the group consisting of titanium hydroxide, aluminum hydroxide, zirconium hydroxide, tin hydroxide, boron hydroxide, silicon hydroxide, zinc hydroxide, germanium hydroxide, tantalum hydroxide, niobium hydroxide, hafnium hydroxide, gallium hydroxide and combinations thereof.

In other embodiments, the coating comprises at least one layer which contains an oxyhalide. In more preferred embodiments, the oxyhalide is selected from the group consisting of oxychloride, oxybromide and oxyiodide of titanium, aluminum, zirconium, tin, boron, silicon, zinc, germanium, tantalum, niobium, hafnium, gallium and combinations thereof.

In yet other embodiments, the coating comprises at least one layer which is a product of hydrolysis of metal, or semiconductor alkoxide, metal alkyl, or metal or semiconductor tetrachloride. Such a product is typically a mixture of metal or semiconductor oxide, hydroxide, oxyhalide and anionic halide.

The coating material can also be a polymer such as an epoxy.

In certain embodiments, the invention provides, among other things, a phosphor grain or particle coated with at least one layer of a coating comprising a product of hydrolysis of metal or semiconductor alkoxides, metal alkyl, or metal or semiconductor tetrachloride. The layer(s) of the coating on the phosphor grain or particle renders the phosphor relatively more resistant to water-induced degradation as compared to an uncoated phosphor. That is to say, the layer(s) of the coating increases the resistance of the phosphor to degradation stimulated by water (in all its forms), so that, for example, without limitation, the coated phosphor maintains about 80% of its original optical performance after exposure to about 85° C. and about 85% relative humidity for about 100 hours.

For example, in certain embodiments, the phosphor of the present invention comprises (a) a phosphor as disclosed herein; and (b) at least one layer of a coating on the phosphor, wherein the layer comprises at least one product of hydrolysis of metal or semiconductor alkoxide, metal alkyl, or metal or semiconductor tetrachloride. In certain embodiments, the phosphor is comprised of particles; in certain embodiments, the phosphor is comprised of grains.

In certain embodiments, the product of hydrolysis of metal or semiconductor alkoxides, metal alkyl, or metal or semiconductor tetrachlorides is titanium oxide, aluminum oxide, zirconium oxide, tin oxide, boron oxide, silicon oxide, zinc oxide, germanium oxide, aluminum silicate, $Al_8BSi_3O_{19}$(OH), $B_2Al_2(SiO_4)_2(OH)$, $ZnAl_2O_4$, $Al_2SiO_5$, $Al(SiO_4)_3$, $ZrSiO_4$, or a combination thereof. In certain embodiments, the coating comprises titanium oxide, aluminum oxide or silicon oxide, or a combination thereof.

In certain embodiments, the coating of the phosphor of the present invention has at least two layers. In certain embodiments, each layer independently comprises a product of hydrolysis of metal or semiconductor alkoxides, metal alkyl, or metal or semiconductor tetrachloride chosen from titanium oxide, aluminum oxide, silicon oxide and a combination thereof. In certain embodiments, one layer of the coating comprises titanium oxide.

Additionally provided by the present invention is a method of coating a phosphor grain or particle comprising: (a) providing a phosphor as disclosed herein, and (b) exposing the phosphor to a product of hydrolysis of metal or semiconductor alkoxides, metal alkyl, or metal or semiconductor tetrachloride to yield at least one layer of coating that renders the phosphor relatively more resistant to water-induced degradation than when it is uncoated (e.g., the coated phosphor maintains about 80% of its original optical performance after exposure to 85° C. and 85% relative humidity for about 100 hours). The method of coating coats particles and grains of phosphor.

In one embodiment, the phosphor grains or particles are coated by agitating or suspending them so that all sides have substantially equal exposure (i.e., the majority, e.g., about 50% of the surfaces of the phosphor grains or particles are exposed) to certain coating vapor or liquid during the period of the coating operation. For example, and without limitation, the grains or particles can be suspended in a fluidized bed, or agitated or stirred in a liquid. Gas used to fluidize the grains or particles can include the vapor used to coat the grains or particles. For example, and without limitation, the gas can include an inert gas carrier (i.e., a gas that is non-reactive under normal circumstances) and the coating vapor. Carrier gas can be passed through vessel(s) of predominately (i.e., principally, for the most part or primarily, such as, about 60%) liquid or solid form precursor to carry away vapor for use in the coating. The vessel(s) and connecting pathways can be heated as needed to maintain sufficient vapor pressure.

Where two or more products of hydrolysis of metal or semiconductor alkoxides, metal alkyl, or metal or semiconductor tetrachloride are used in forming the same coating layer, carrier gas can be passed separately through vessels of the separate precursors and mixed prior to, or in, the coating reaction chamber of a reaction vessel. Relative carrier gas flow rates through the separate vessels can be adjusted to carry the desired amount of precursor in light of vapor pressure or empirical coating results. Water vapor is carried similarly to the reaction vessel, with an amount moderated similarly, as appropriate. In liquid-mediated coating methods, any number of dispensing methods can be used to incorporate multiple precursors into the liquid.

Coating can be accomplished through hydrolysis to form a surface oxide on the phosphor grains or particles, with the hydrolysis occurring in a vapor phase and/or in a liquid phase. An example of the former is chemical vapor deposition (CVD), while of the latter is a sol-gel process.

In vapor phase deposition reactions (i.e., a hydrolytic deposition reaction), the uncoated phosphors can be floated by a carrier gas in a reaction chamber to disperse the phosphors as substantially single particles (e.g., more than 95 percent (>95%) of the particles have no association, agglomeration or aggregation). The chamber can be heated to an appropriate temperature given the reactants (e.g., in some implementations, about 200° C.). Coating precursor materials in the vapor phase then are introduced into the chamber. Under the temperature conditions, at least a portion of precursor (e.g., about 20%) is decomposed hydrolytically to form a layer containing either oxide or hydroxide or oxychloride or a mixture thereof on the surfaces of the phosphor particles, thereby microencapsulating them. A typical hydrolysis that can be used in the present invention is as follows:

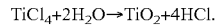

$$TiCl_4 + 2H_2O \rightarrow TiO_2 + 4HCl.$$

Products of hydrolysis of metal or semiconductor alkoxides, metal alkyl, or metal or semiconductor tetrachloride useful in the present invention are, for example, and without limitation, titanium oxides (e.g., $TiO_2$), aluminum oxide (e.g., $Al_2O_3$), zirconium oxide (e.g., $ZrO_2$), tin oxides (e.g., $SnO_2$), boron oxide (e.g., $B_2O_3$), silicon oxide (e.g., $SiO_2$), zinc oxide (e.g., ZnO), germanium oxide (e.g., $GeO_2$), tantalum oxide (e.g., $Ta_2O_5$), niobium oxide (e.g., $Nb_2O_5$), hafnium oxide (e.g., $HfO_2$), gallium oxide (e.g., $Ga_2O_3$), and the like. Further products useful in the present invention include oxides formed with more than one type of cation, for example, aluminum silicate (such as, $3Al_2O_3 \cdot 2SiO_2$ or in mullite form), Al$_8$BSi$_3$O$_{19}$(OH) (such as, in dunortierite form), B$_2$Al$_2$(SiO$_4$)$_2$(OH) (such as, in euclase form), ZnAl$_2$O$_4$ (such as, in gahnite form), Al$_2$SiO$_5$ (such as, in sillimanite form), ZrSiO$_4$ (such as, in zircon form), and the like. In certain embodiments, for use in the method of the present invention, volatile or appropriately soluble precursors that hydrolytically generate the oxides are used. Such precursors are known in the art.

In certain embodiments, the product of hydrolysis of metal or semiconductor alkoxides, metal alkyl, or metal or semiconductor tetrachloride layer comprises predominantly (e.g., about 60%) one type of product of hydrolysis of metal or semiconductor alkoxides, metal alkyl, or metal or semiconductor tetrachloride (as determined by the metal or semiconductor component), e.g., layer of titanium oxide, aluminum oxide, or silicon oxide. In certain embodiments, the coating of the present invention comprises two or more layers that are predominantly one type of a product of hydrolysis of metal alkoxides, metal alkyls, or titanium tetrachloride. For example, the layers can be made separately of two or more titanium oxides, aluminum oxides, or silicon oxides. In certain embodiments, one layer of the coating of the present invention is of silicon oxide, and another is of a titanium oxide or aluminum oxide.

Examples of precursors which may be used in the hydrolysis step to produce the coatings of the present invention include, e.g., metal alkyls, such as trimethylaluminum (Al(CH$_3$)$_3$), trimethylboron (B(CH$_3$)$_3$), tetramethylgermanium (Ge(CH$_3$)$_4$) and tetraethylzirconium (Zr(C$_2$H$_5$)$_4$); mixed halo (i.e., comprising fluorine, chlorine, bromine, iodine or astatine) and alkyl derivatives of metals, such as dimethylaluminum chloride (Al(CH$_3$)$_2$Cl), diethyldichlorsilane (Si(CH$_2$CH$_3$)$_2$Cl$_2$) and triethylchlorsilane (Si(CH$_2$CH$_3$)$_3$Cl), metal or semiconductor alkoxides, such as titanium (IV) methoxide (Ti(OCH$_3$)$_4$), tetraethylorthosilicate (Si(OCH$_2$CH$_3$)$_4$, TEOS)) and tetramethylorthosilicate (Si(OCH$_3$)$_4$); halogenated metals or semiconductors, such as titanium tetrachloride (TiCl$_4$) and silicon tetrachloride (SiCl$_4$), and combinations or mixtures thereof.

With the aid of vapor water, these compounds can be hydrolyzed to yield their respective oxides. As used herein, "halogenated metals" refers to metal cations and anions of group VII elements of the periodic table of chemical elements that are ionically or covalently bonded. As used herein, "metal alkyl" refers to a molecule having metal linking with one or more alkyl groups comprising at least one C1 to C16 straight or branched moiety, such as, methyl, diethyl, propyl, isopropyl, butyl, tert-butyl, pentyl, hexyl, octyl, nonyl and decyl. As used herein, "alkyl" refers to a saturated hydrocarbon group that is unbranched (i.e., straight-chained) or branched (i.e., non-straight chained). Example alkyl groups, without limitation, include methyl (Me), ethyl (Et), propyl (e.g., n-propyl and isopropyl), butyl (e.g., n-butyl, isobutyl, t-butyl), pentyl (e.g., n-pentyl, isopentyl, neopentyl), and the like. In certain embodiments of the present invention, an alkyl group can contain from about 1 to about 10, from about 2 to about 8, from about 3 to about 6, from about 1 to about 8, from about 1 to about 6, from about 1 to about 4, from about 1 to about 3 carbon atoms, or from about 1, 2, 3, 4, 5, 6, 7, 8, 9 or 10 carbon atoms. As used herein, "alkoxide" refers to an alkyl-O— moiety, wherein alkyl is as previously defined.

In certain embodiments of the present invention, the method of coating a phosphor comprises a hydrolytic deposition reaction, where the hydrolytic deposition reaction is conducted at a temperature selected (in light of the given phosphor) to retain useful fluorescence (e.g., having an optical performance of about 80% of its uncoated version). The temperature of a vapor phase deposition can be, for example, from about 25° C. to about 400° C. The temperature can be, for example, at least about 25° C., at least about 50° C., at least about 75° C., at least about 100° C., at least about 150° C., or at least about 200° C. The temperature can be, for example, at most about 400° C., at most about 300° C., at most about 275° C., at most about 250° C., at most about 225° C., or at most about 200° C. The temperature of a liquid phase deposition can be, for example, from about 25° C. to about 90° C., depending on the reactants, the solvent, and the stability of the phosphor to the temperature. The temperature can be, for example, at least about 25° C., at least about 30° C., at least about 35° C., at least about 40° C., at least about 45° C., at least about 50° C., at least about 55° C., at least about 60° C., at least about 65° C., or at least about 70° C. The temperature can be, for example, at most about 90° C., at most about 85° C., at most about 80° C., at most about 75° C., at most about 70° C., at most about 65° C., at most about 60° C., at most about 55° C., or at most about 50° C. The temperature is, of course, lower than the boiling point of the solvent at the operative pressure.

In certain embodiments, the coatings of the present invention can be substantially transparent (such that useful fluorescence is retained) and are typically between about 0.1 micron and about 3.0 microns thick or between about 0.05 micron and about 0.50 micron thick. Coatings that are too thin (e.g., at least less than about 0.005 micron (5 nm) thick) tend to provide insufficient impermeability to moisture, i.e., the coating fails to provide a phosphor protection from moisture whereby the phosphor degrades and loses its photoluminescence. Coatings that are too thick (e.g., greater than about 3.0 microns thick) can tend to be less transparent and result in reduced brightness of the coated phosphor.

Additional Phosphors

The phosphors of the present invention may also be combined with other phosphors, such those described in U.S. Pat. No. 7,276,183 and U.S. Publication Nos. 2007-0125982 and 2008-0128679, the disclosures of which are hereby incorporated by reference in their entireties.

For example, the phosphors of the present invention may be combined with phosphors having the following formula: the phosphors of the invention are according to the formula:

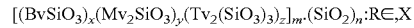

$$[(BvSiO_3)_x(Mv_2SiO_3)_y(Tv_2(SiO_3)_3)_z]_m \cdot (SiO_2)_n:RE,X$$

wherein Bv is one or more divalent metal ions; Mv is one or more a monovalent ions; Tv is one or more trivalent metal ions; x, y and z are any value such that x+y+z<1; RE is one or more activators selected from Eu$^{2+}$ and Mn$^{2+}$, and X is one or more monovalent halides selected from F$^-$, Cl$^-$, Br$^-$ or I$^-$. RE is present, for example, in an amount effective to provide luminescent emission. The value of m is 1 or 0. The value of n is >3 if m=1, and is such as to provide an amount of silica effective to host useful luminescence. The value of n is 1 if m=0. Bv, Mv and Tv are metal ions that support the formation of the metal silicates.

Other phosphors useful for combination with the phosphors of the present invention include, e.g., phosphor having a formula selected from $(M1_xM2_{1-x})_2LiSiO_4X:A$; $(M1_xM2_{1-x})_5SiO_4X_6:A$; $(M1_xM2_{1-x})_3SiO_4X_2:A$; $(M1_xM2_{1-x})_5(SiO_4)_2X_2:A$; $(M1_xM2_{1-x})_5Si_2O_7X_4:A$; $(M1_xM2_{1-x})_{10}(Si_2O_7)_3X_2:A$; $(M1_xM2_{1-x})_4Si_2O_7X_2:A$; $(M1_6M2_4)(Si_2O_7)_3X_2:A$; $(M1_xM2_{1-x})_7Si_2O_7X_8:A$; $(M1_xM2_{1-x})_4Si_3O_8X_2:A$; $(M1_xM2_{1-x})_4Si_3O_8X_4:A$; $(M1_xM2_{1-x})_8Si_4O_{12}X_8:A$; $(M1_xM2_{1-x})_5Si_2O_6X_6:A$; $(M1_xM2_{1-x})_{15}Si_6O_{18}X_8:A$; $(M1_xM2_{1-x})_5Si_4O_{10}X_5:A$; $(M1_xM2_{1-x})_{10}(SiO_4)_3(SO_4)_3X_2:A$; $(M1_xM2_{1-x})_4(SiO_4)(SO_4)X_2:A$; and $(M1_xM2_{1-x})_8Mg(SiO_4)_4X_2:A$, where: M1 and M2 are each independently at least one metal ion selected from the group consisting of $Mg^{2+}$, $Ca^{2+}$, $Sr^{2+}$, $Ba^{2+}$, $Zn^{2+}$ and $Cd^{2+}$; X is a value from about 0.001 to about 1; X is at least one halide ion in ionic form; A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{2+}$, $Gd^{3+}$, $Tb^{3+}$, $Dy^{3+}$, $Ho^{3+}$, $Er^{3+}$, $Tm^{3+}$ and $Yb^{3+}$; if the phosphor has the formula $(M1_xM2_{1-x})_2LiSiO_4X:A$, and M1 is $Sr^{2+}$, x is 1 and X is fluoride or M2 is $Sr^{2+}$, x is 0 and X is fluoride, then A is not $Eu^{2+}$; and if the phosphor has the formula $(M1_xM2_{1-x})_3SiO_4X_2:A$, and M1 is $Ca^{2+}$, x is 1 and X is chloride or M2 is $Ca^{2+}$, x is 0 and X is chloride, then A is not $Eu^{2+}$; and if the phosphor has the formula $(M1_xM2_{1-x})_8Mg(SiO_4)_4X_2:A$, and M1 is $Ca^{2+}$, x is 1 and X is chloride or M2 is $Ca^{2+}$, x is 0 and X is chloride, then A is not $Eu^{2+}$.

Further phosphors useful in combination with the phosphors of the present invention include, e.g., a phosphor having a formula of:

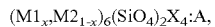

$$(M1_x,M2_{1-x})_6(SiO_4)_2X_4:A,$$

where: M1 and M2 are each independently at least one metal ion selected from the group consisting of $Mg^{2+}$, $Ca^{2+}$, $Sr^{2+}$, $Ba^{2+}$, $Zn^{2+}$ and $Cd^{2+}$; x is a value from about 0.001 to about 1; X is at least one halide ion in ionic form; and A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$.

Light Emitting Devices

In certain embodiments, the light emitting device of the present invention comprises a semiconductor light source, such as a LED, to either create excitation energy, or to excite another system to thereby provide the excitation energy for the phosphor of the present invention. Devices using the present invention can include, for example, and without limitation, white light producing light emitting devices, indigo light producing light emitting devices, blue light producing light emitting devices, green light producing light emitting devices, yellow light producing light emitting devices, orange light producing light emitting devices, pink light producing light emitting devices, red light producing light emitting devices, or light emitting devices with an output chromaticity defined by the line between the chromaticity of a phosphor of the present invention and that of at least one second light source. Headlights or other navigation lights for vehicles can be made with the light emitting devices of the present invention. The light emitting devices can be output indicators for small electronic devices, such as cell phones and personal digital assistants (PDAs). The light emitting devices of the present invention also can be the backlights of the liquid crystal displays for cell phones, PDAs and laptop computers. Given appropriate power supplies, room lighting can be based on devices of the invention. The warmth (i.e., amount of yellow/red chromaticity) of light emitting devices of the present invention can be manipulated by selection of the ratio of light from a phosphor of the present invention to light from a second source (including, a second phosphor of the present invention). Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like.

Suitable semiconductor light sources for use in the present invention also are any that create light that excites the phosphors of the present invention, or that excites a different phosphor that in turn excites the phosphors of the present invention. Such semiconductor light sources can be, for example, and without limitation, GaN (gallium nitride) type semiconductor light sources, In—Al—Ga—N type semiconductor light sources ($In_iAl_jGa_kN$, where i+j+k=about 1, where two or more of i, j and k can be 0), BN, SiC, ZnSe, BAlGaN, and BInAlGaN light sources, and the like. The semiconductor light source (e.g., a semiconductor chip) can be based, for example, on III-V or II-VI quantum well structures (meaning structures comprising compounds that combine elements of the periodic table of the chemical elements from Group III with those from Group V or elements from Group TI with those from Group VI). In certain embodiments, a blue or a near ultraviolet (UV) emitting semiconductor light source is used.

It will be understood by those of ordinary skill in the art that there are any number of ways to associate phosphors with a semiconductor light source (e.g., a LED light source) such that light color from the semiconductor light source is changed by the phosphors. U.S. Published Patent Applications No. 2004/0145289 and U.S. Pat. No. 7,210,977 illustrate light emitting devices where a phosphor is positioned away from the light output of the semiconductor light sources. U.S. Pat. No. 6,936,857 further illustrates, without limitation, light emitting devices that can be used in the present invention.

In certain embodiments, the phosphors of the present invention can be excited by light from a primary source, such as, a semiconductor light source (e.g., a LED) emitting in the wavelength range of about 300 to about 500 nm, from about 350 nm to about 450 nm or about 330 nm to about 390 nm, or from a secondary light source, such as, emissions from other phosphor(s) that emit in the wavelength range of about 300 nm to about 500 nm or about 350 nm to about 420 nm. Where the excitation light is secondary, in relation to the phosphors of the present invention, the excitation-induced light is the relevant source light. Devices that use the phosphor of the present invention can include, for example, and without limitation, mirrors, such as, dielectric mirrors, which direct light produced by the phosphors of the present invention to the light output, rather than direct such light to the interior of the device (such as, the primary light source).

The semiconductor light source (e.g., a LED) can, in certain embodiments, emit light of at least about 200 nm, at least about 250 nm, at least about 255 nm, at least about 260 nm, and so on in increments of about 5 nm to at least about 600. The semiconductor light source can, in certain embodiments, emit light of at most about 600 nm, at most about 595 nm, at most about 590 nm, and so on in increments of about 5 nm to or less about 200 nm.

When LED chips are used, the LED chips are advantageously filled with a transparent encapsulant with a dome-like shape. The encapsulant provides the mechanical protection on one hand, and the encapsulant further improves the optical property on the other hand (improved light emission of the LED die).

The phosphor may be dispersed in an encapsulant. By the encapsulant, the LED chips disposed on the substrate and a polymer lens are bonded without containing a gas as much as possible. The LED die can be sealed directly by the encapsulant. However, it is also possible that the LED die is sealed with a transparent encapsulant (i.e., in this case, there are the transparent encapsulant and the encapsulant to contain the phosphor). Owing to the refraction indices close to each other, there is little loss of reflection at the interface.

In structural modifications, one or more LED chips are disposed on a substrate in a reflection mirror and the phosphor is dispersed in a lens disposed on the reflection mirror. Alternatively, one or more LED chips may be disposed on a substrate in a reflection mirror and the phosphor coated on the reflection mirror.

In certain embodiments of the present invention, phosphors of the present invention can be dispersed in the light emitting device with a binder, a solidifier, a dispersant, a filler or the like. The binder can be, for example, and without limitation, a light curable polymer, such as, an acrylic resin, an epoxy resin, a polycarbonate resin, a silicone resin, a glass, a quartz and the like. The phosphor of the present invention can be dispersed in the binder by methods known in the art. For example, in some cases, the phosphor can be suspended in a solvent with the polymer suspended, dissolved or partially dissolved in the solvent, thus forming a slurry, which then can be dispersed on the light emitting device and the solvent evaporated therefrom. In certain embodiments, the phosphor can be suspended in a liquid, such as, a pre-cured precursor to the resin to form a slurry, the slurry then can be dispersed on the light emitting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof. In certain embodiments, the binder used to disperse the phosphor particles in a light emitting device can be liquefied with heat, thereby, a slurry is formed, and then the slurry is dispersed on the light emitting device and allowed to solidify in situ. Dispersants (meaning a substance that promotes the formation and stabilization of a mixture (e.g., a suspension) of one substance into another) include, for example, and without limitation, titanium oxides, aluminum oxides, barium titanates, silicon oxides, and the like.

The polymer lens advantageously has a spherical or oval dent. The dent is filled with the encapsulant. As a result, the LED array is fixed at a short distance from the polymer lens. Thereby, the mechanical structure size can be reduced.

To achieve a homogeneous distribution of the phosphor, it is advantageous that the phosphor is suspended in an inorganic matrix.

In preferred embodiments, the light emitting devices of the present invention comprise two different phosphors, and in this case, at least one of the phosphors is a phosphor as disclosed herein. Thereby, the white tone can be particularly adjusted to be accurate. It can be useful to disperse the phosphors separately, and superimpose the phosphors as layers instead of dispersing the phosphors together in one matrix. Such layering can be used to obtain a final light emission color by way of a plurality of color conversion processes. For example, the light emission process is: absorption of the light emission of a semiconductor light source by a first phosphor of the present invention, light emission by the first phosphor, absorption of the light emission of the first phosphor by a second phosphor, and the light emission by the second phosphor. In certain embodiments, the second phosphor is also a phosphor of the present invention.

In the case that two phosphors are used, it may be advantageous that the two phosphors are suspended in each matrix, and, in that case, these matrices are disposed back and forth in the light propagation direction. Thereby, the matrix concentration can be reduced compared with the case that the different phosphors are dispersed mixed together.

The present invention further provides a light emitting device comprising: a LED producing light output (i.e., a LED that emits light) of wavelengths of from about 200 to about 600 nm, preferably from about 350 to about 420 nm; and a coated phosphor according to the present invention, where the phosphor is situated to absorb at least a portion of the light output from the LED and effectively modifies the chromaticity of the light absorbed from the LED, resulting in it emitting light of a longer wavelength than that of the light absorbed from the LED. As used herein, the phrase "a portion of the light output" refers to a fraction of optical energy, or a fraction of photons, emitted from the LED. For example, and without limitation, more than about 50% of the emitted optical energy from the LED is absorbed by the phosphor. In certain embodiments, the LED emits light in the near ultraviolet (UV) range (e.g., about 400 nm) or the blue range (e.g., about 450 nm). In certain embodiments, the coated phosphor modifies the chromaticity of the absorbed portion of LED-emitted light into green light (e.g., about 540 nm) or red light (e.g., about 630 nm). In certain embodiments, the coated phosphor modifies the chromaticity of the absorbed portion of LED-emitted light into light of about 550 nm.

In certain embodiments, the light emitting device of the present invention, can, for example, comprise a gallium nitride-based LED with a light-emitting layer comprising a quantum well structure. The light emitting device can include a phosphor of the present invention and a reflector located so as to direct light from the LED or the coated phosphor. The coated phosphor of the present invention can be located on the surface of the LED or separated therefrom. The light emitting device can further include a translucent material encapsulating (meaning enclosing or covering) the LED (or portion thereof from which the light output emerges) and the phosphor.

The disclosed phosphor products can be used to make white LED lamps, such as, lamps seeking to deliver a high color rendering index (CRI >about 75), a high efficiency (>about 80%) and long lifetimes (>about 10,000 hrs.), which are unachievable with existing phosphor products. In certain embodiments, the light source of the present invention (e.g., a white LED lamp) delivers a high CRI of at least about 84, a high efficiency of at least about 90% and long lifetimes of at least about 100,000 hours.

In certain embodiments, the emission peak for a phosphor of the present invention is measured with the emission wavelength source being lit at about 550 nm±about 100 nm. In certain embodiments, the emission range for a phosphor of the present invention is, for example, and without limitation, from one of the following lower endpoints (inclusive or exclusive) of: about 450 nm, about 451 nm, about 452 nm, about 453 nm, and each one nm increment up to about 649 nm and from one of the following upper endpoints (inclusive or exclusive) of: about 650 nm, about 649 nm, about 648 nm, about 647 nm, and each one nm down to about 451 nm.

In certain embodiments, the excitation peak range for a phosphor of the present invention is, for example, and without limitation, from one of the following lower endpoints (inclusive or exclusive) of: about 300 nm, about 301 nm, about 302 nm, about 303 nm, and each one nm increment up to about 449 nm and from one of the following upper endpoints (inclusive or exclusive): about 450 nm, about 449 nm, about 448 nm, about 447 nm, and each one nm down to about 301 nm.

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g., amounts, temperature, etc.), but an account for some experimental errors and deviations should be made. Unless indicated otherwise, parts are parts by weight, molecular weight is average molecular weight, and temperature is in degrees Centigrade.

EXAMPLES

Example 1

Figure 2:
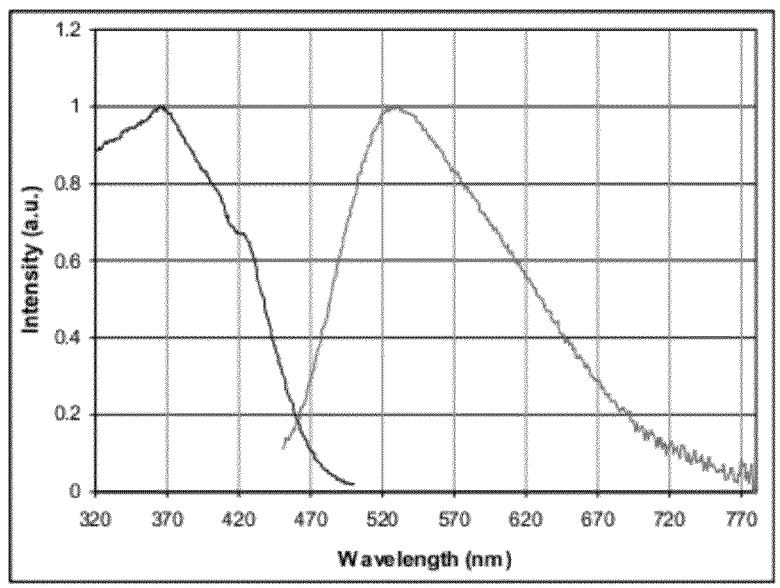
FIG. 2 depicts the excitation (left) and emission (right) spectra of the sample of Example 1.

Powder materials of $Eu_2O_3$ (1.10 g), $Ce(NO_3)_3$ (0.33 g), $SiO_2$ (15.02 g), $CaCO_3$ (25.02 g), and $SrCO_3$ (36.9 g) were mixed by ball milling. Then $CaCl_2$ (3.9 g) and LiCl (0.03 g) solids were added to the above mixture and mixed well. The mixed powder was fired at 900~1200° C. under reducing gas for 1-10 hours. The product was cooled, pulverized and sieved through a sieve. The powder was then mixed with additional $CaCl_2$ (3.9 g) and fired again at 900~1200° C. under reducing gas for 1-5 hours. The product was cooled and pulverized and then sieved. After cooling and grinding, the product powder was washed with a mixture of methanol/water in an ultrasonic bath. After settling the suspension was decanted and the phosphor was washed with methanol. After drying, the powder was sieved again. The fluorescence excitation and emission spectra are shown in FIG. 2. X-ray powder diffraction pattern shows the structure of the sample crystals to be in a modified orthorhombic form of the space group $P2_1cn$.

Example 2

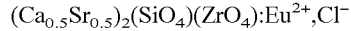

Figure 3:
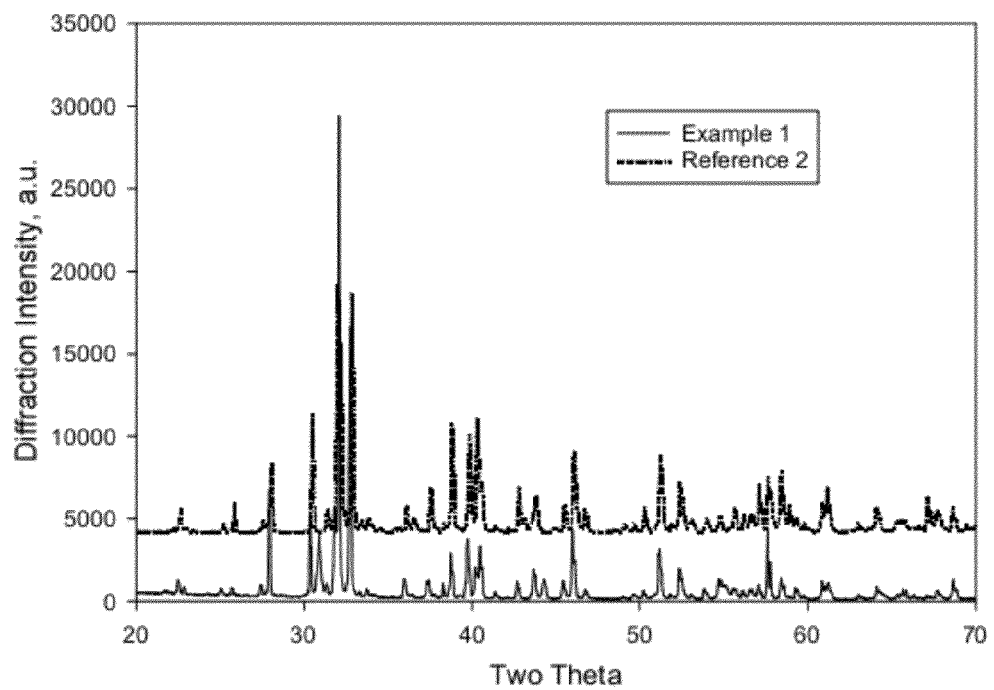
FIG. 3 depicts the XRD patterns of the phosphors of Example 1 and Reference 2.
Figure 4:
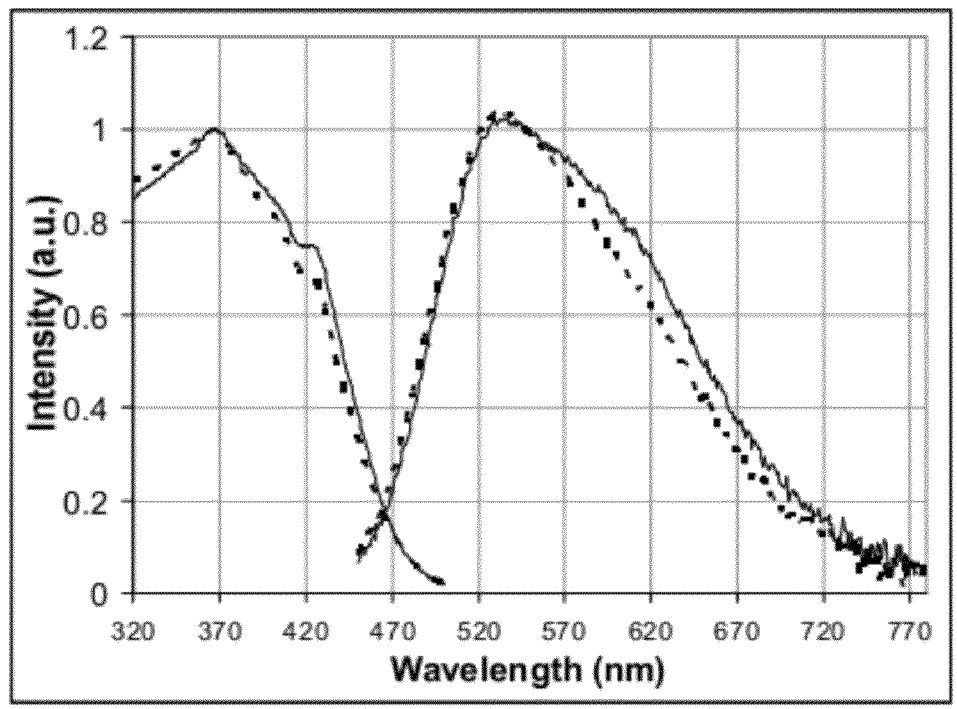
FIG. 4 depicts the excitation (left) and emission (right) spectra of the sample in Example 2 (solid line) and Example 3 (dotted line).

Powder materials of $Eu_2O_3$ (1.10 g), $SiO_2$ (13.52 g), $ZrO(NO_3)_2$ (5.78 g), $CaCO_3$ (25.02 g) and $SrCO_3$ (36.91 g) were mixed. The flux $CaCl_2$ (3.9 g) was then mixed with the above-mentioned mixed powder. The powder was then fired at 900-1400° C. under reducing gas for 1-10 hours. After cooling, the product was ground and sieved. The product was again mixed with $CaCl_2$ (3.9 g) and fired at 1000-1400° C. under reducing gas. After cooling and grinding, the product was sieved. The product powder was then washed with methanol/water. After settling, the supernatant was decanted and the phosphor was washed with methanol/water. The washing was repeated twice and then the powder was dried. X-ray diffraction pattern of the sample shows the structure of a modified orthorhombic crystal with space group of $P2_1cn$ (FIG. 3). Fluorescence excitation and emission spectra are shown in FIG. 4.

Example 3

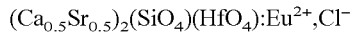

Powder materials of $Eu_2O_3$ (1.10 g), $SiO_2$ (15.02 g), $HfO_2$ (5.26 g), $CaCO_3$ (25.02 g) and $SrCO_3$ (36.91 g) were mixed. The flux material, $CaCl_2$ (3.9 g), was mixed with the above mixed powder. The powder was then fired at 900-1400° C. under reducing gas. After cooling, the product was ground and sieved. The fired powder was then mixed with $CaCl_2$ (3.9 g) and fired again at 1000-1400° C. under reducing gas. After cooling and grinding, the product was sieved. The product was then washed with methanol/water mixture. After settling, the supernatant was decanted off and the phosphor was washed with methanol/water mixture. The washing step was repeated twice and then the powder was dried. X-ray diffraction pattern shows the structure of a modified orthorhombic ($P2_1cn$) crystal structure. The fluorescence excitation and emission spectra are shown in FIG. 4.

Example 4

Figure 5:
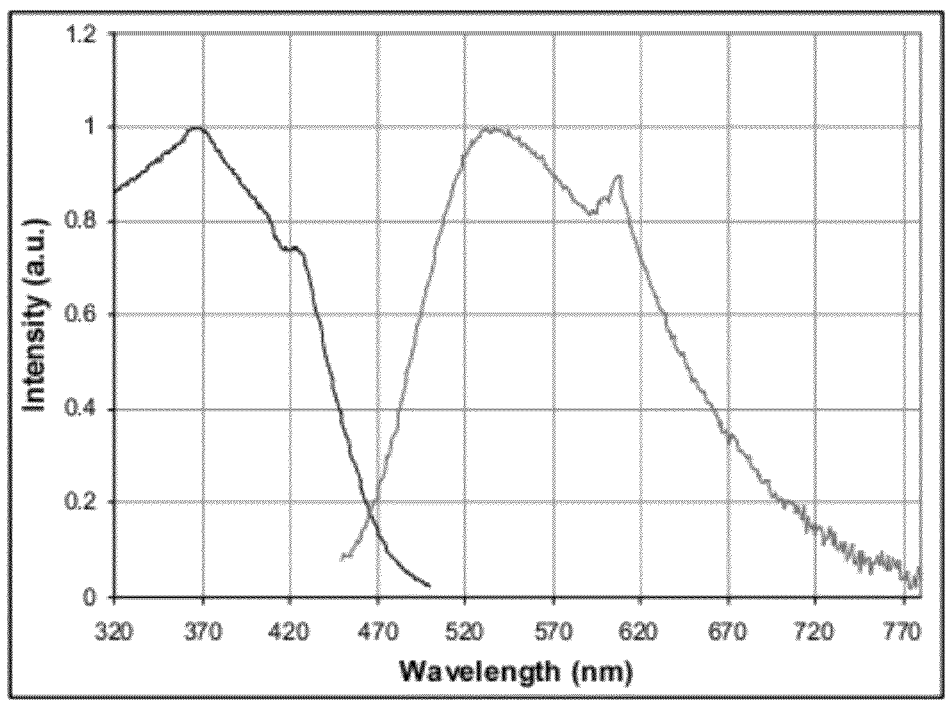
FIG. 5 depicts the excitation (left) and emission (right) spectra of the sample on Example 4.

Powder materials of $Eu_2O_3$ (1.10 g), $Pr_6O_{11}$ (0.21 g), $SiO_2$ (15.02 g), $CaCO_3$ (25.02 g) and $SrCO_3$ (36.9 g) were mixed. LiOH (0.03 g) and $CaCl_2$ were then added to the mixed powder. The powder was then fired at 900-1300° C. under reducing gas. After cooling, the intermediate product was ground and sieved. The fired powder was then mixed with $CaBr_2$ (6.9 g) and fired again at 900-1400° C. under reducing gas. After cooling and grinding, the product was sieved. The product was then washed with methanol/water mixed liquid. After settling, the supernatant was decanted and the phosphor was washed with methanol/water liquid. The washing step was repeated twice and then the powder was dried. The fluorescence excitation and emission spectra are shown in FIG. 5.

Example 5

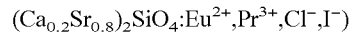

Figure 6:
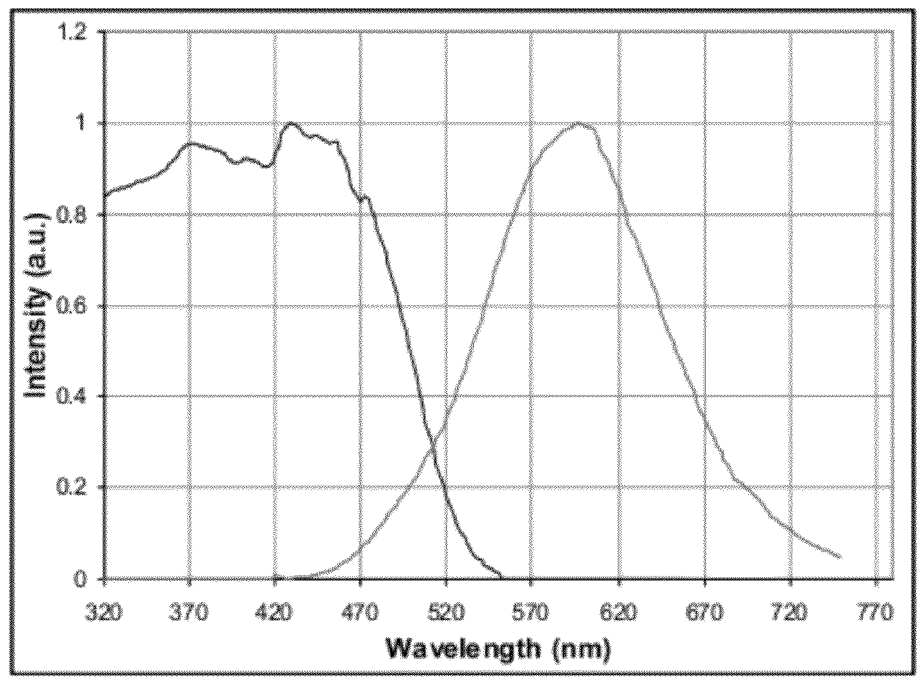
FIG. 6 depicts the excitation (left) and emission (right) spectra of the sample in Example 5.
Figure 7:
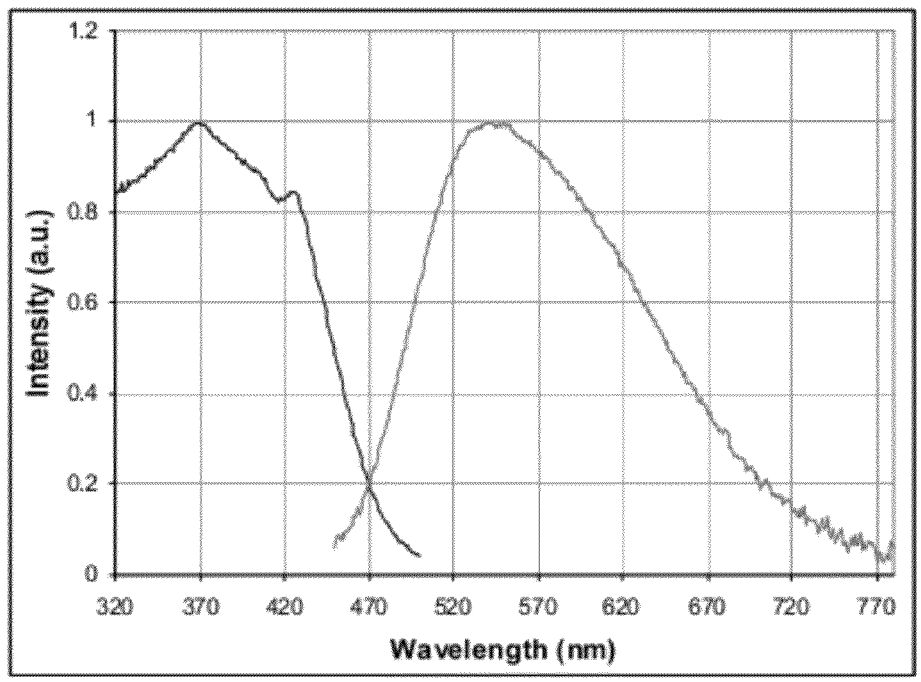
FIG. 7 depicts the excitation (left) and emission (right) spectra of the sample in Example 6.
Figure 8:
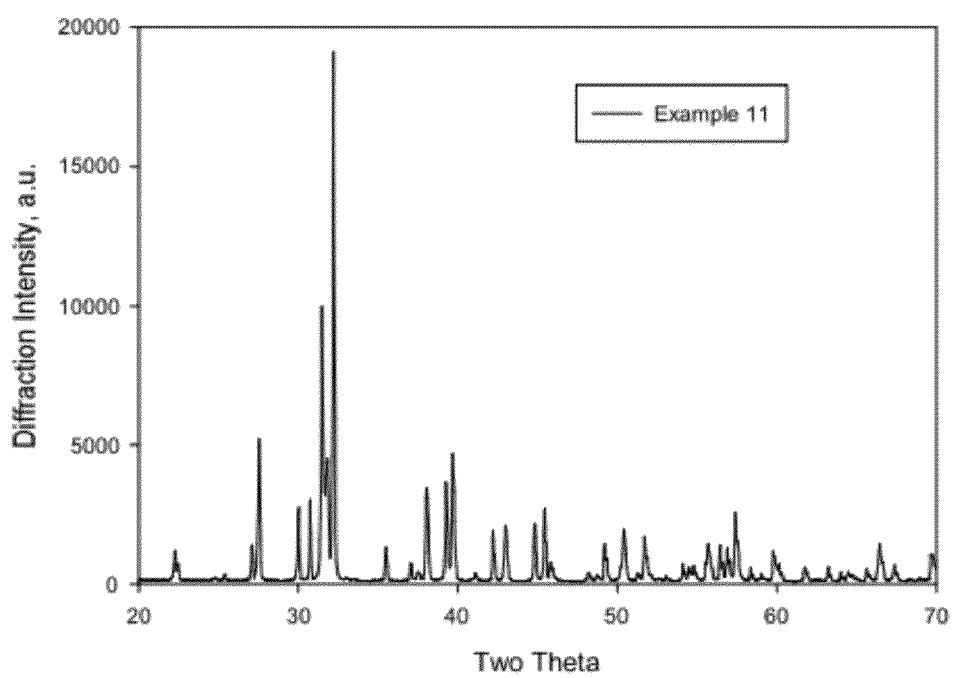
FIG. 8 depicts the XRD pattern of the phosphor of Example 11.

Powder materials of $Eu_2O_3$ (1.10 g), $Pr_6O_{11}$ (0.043 g), $SiO_2$ (15.02 g), $CaCO_3$ (10.01 g), $SrCO_3$ (59.05 g) were mixed. A mixed powder, $CaCl_2$ (2.56 g) and $CaI_2$ (1.70 g) was added to the above mixture and mixed well. The mixed powder was then fired at 900-1400° C. under reducing gas. The product was cooled, ground and sieved. The sieved powder was washed with mixture of methanol/water. After setting for 5 minutes, the supernatant was decanted and the phosphor was washed with methanol. The washing step was repeated twice, the powder was then dried. X-ray diffraction pattern shows the pure crystalline phase of a modified orthorhombic (Pmnb) structure (FIG. 6). The fluorescence excitation and emission spectra are shown in FIG. 7.

Example 6

Powder materials of $Eu_2O_3$ (1.10 g), $Yb_2O_3$ (0.49 g), $SiO_2$ (15.02 g), $CaCO_3$ (25.02 g) and $SrCO_3$ (36.9 g) were mixed. $CaCl_2$ was then added to the mixed powder. The powder was then fired at 900-1200° C. under reducing gas. After cooling, the product was ground and sieved. The fired powder was then mixed with $CaCl_2$ (3.9 g) and fired again at 900-1200° C. under reducing. After cooling and grinding, the product was sieved. The product was then washed with methanol/water mixture. After settling, the supernatant was decanted and the phosphor was washed with methanol/water again. The washing step was repeated twice and then the powder was dried. After drying, the powder was sieved. X-ray diffraction pattern shows the structure of an orthorhombic (P21cn) crystal structure. The fluorescence excitation and emission spectra are shown in FIG. 7.

Examples 7-11

Figure 9:
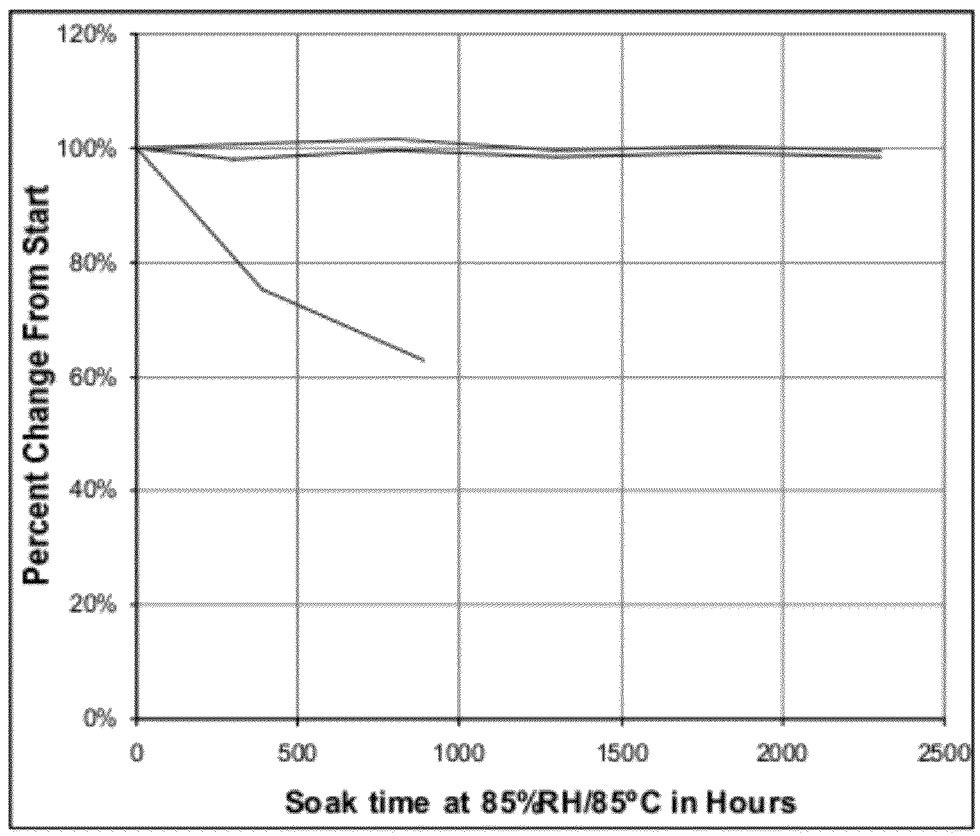
FIG. 9 depicts the luminescence maintenance of the coated phosphors (upper lines) of Example 12 in comparison with the uncoated phosphor (lower line) under 85° C./85% relative humidity conditions.

The luminescence features of a phosphor include its excitation and emission curves, emission peak wavelength ($\lambda_{em}$), emission band width (FWHH) and emission efficiency (brightness). The emission color of a phosphor luminescence light is characterized by chromaticity coordinates (x, y on CIE 1931 Chromaticity Diagram, Commission Internationale de l'Eclairage). These luminescence features and emission chromaticity of the phosphors of Examples 7 to 11 are summarized in Table 1 together with those of the known prior arts as Reference 1 and Reference 2. It is shown that the additional building blocks in the host crystals, such as $ZrO_4$ (Example 2) and $HfO_4$ (Example 3), narrow the emission bandwidth and thus shift the chromaticity toward the warm white color zone. $C^0$-doping with Pr (Example 5) and Tb (Example 10) trivalent ions significantly improves the brightness.

nitrogen was directed through a water bubbler. A flow through a $TiC_4$ bubbler commenced and was allowed to run for 1-3 hours to form the second layer of coating. The cooled particles were removed. Luminescence maintenance of the coated phosphors under 85° C. and 85% relative humidity conditions is shown in the below FIG. 9 in comparison with their uncoated counterpart.

Example 13

Figure 10:
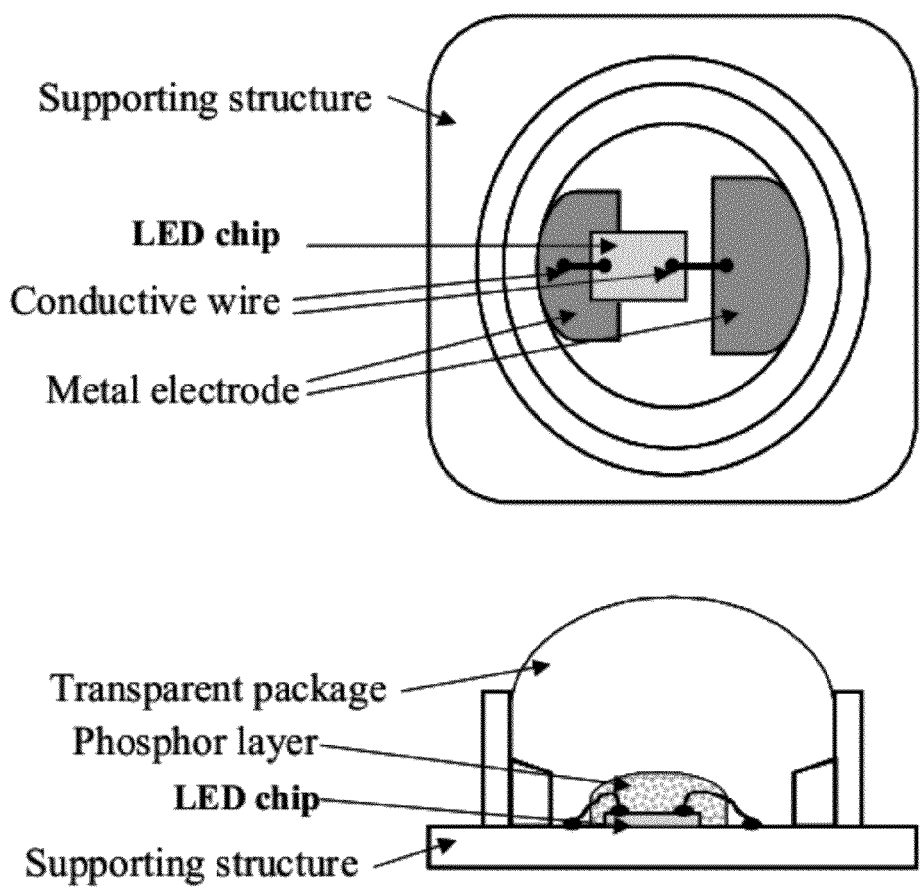
FIG. 10 depicts a light emitting device of Example 13.
Figure 11:
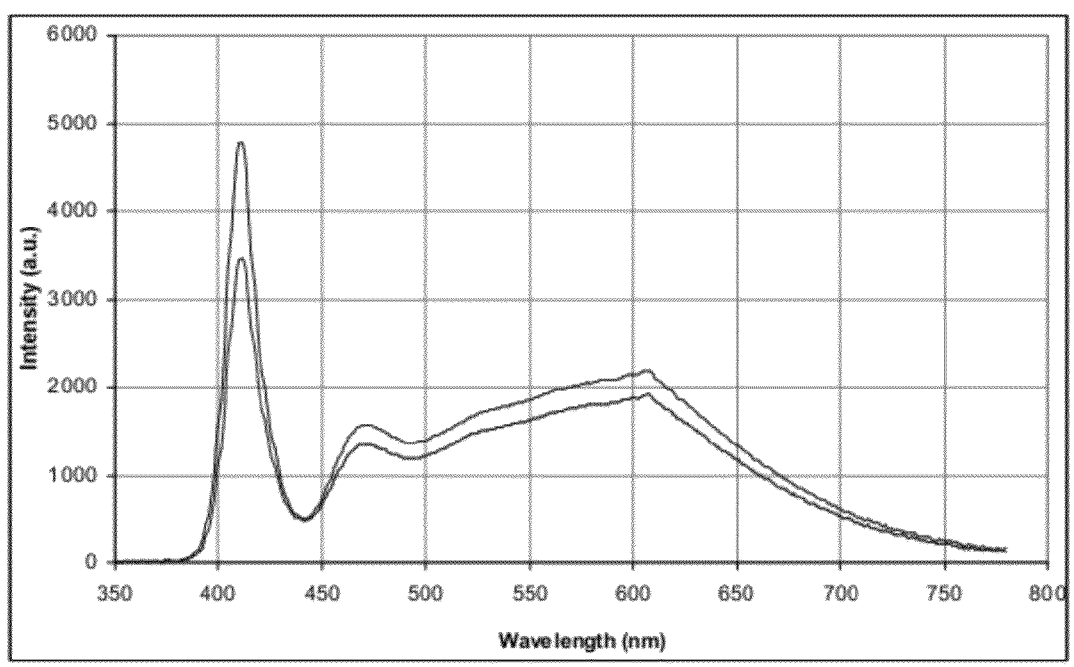
FIG. 11 depicts the emission spectra of the LED lamps of Example 13 which are made from the phosphors of the present invention. The two curves demonstrate two LED lamps (Cv210-b, lower position and Cv201-c, higher position) with different phosphor loadings.

A light emitting device was prepared by combining a LED chip that emits at 405 nm (0.28 mm×0.28 mm, SMD in a white reflector (Clairex Technologies, Plano Tex.) and the phosphor of Example 4, $(Ca_{0.5}Sr_{0.5})_2SiO_4:Eu^{2+}$, $Pr^{3+}$, $Li^+$, $Cl^-$, $Cl^-$, $Br^-$, and a blue-emitting phosphor, $CaSO_3.(SiO_2):Eu^{2+}$, $I^-$, invented in U.S. Pat. No. 7,276,183 in a package shown in FIG. 10. The phosphor powders were mixed with a silicone resin (Dow Corning, JCR 6175) to form a slurry. The slurry was then applied onto the LED chip followed by a heating treatment for curing. The emission spectra of the device operating at different current are shown in FIG. 11. The luminous performance of the light emitting device is listed in Table 2.

TABLE 1

| Sample ID | Formula | $\lambda$em nm | FWHH nm | Chromaticity x | Chromaticity y | Emission Int. a.u.* | Crystal Sys/Space Group |
|---|---|---|---|---|---|---|---|
| Ref 1 | $(Sr_{0.5}Ca_{0.5})_2SiO_4$: Eu | 581 | 109 | 0.401 | 0.504 | 100 | |
| Ref 2 | $(Sr_{0.5}Ca_{0.5})_2SiO_4$: Eu, Cl | 582 | 170 | 0.386 | 0.522 | 103 | Orthorhombic/$P2_1$cn |
| Ex 1 | $(Sr_{0.5}Ca_{0.5})_2SiO_4$: Eu, Ce, Li | 528 | 129 | 0.341 | 0.509 | 112 | Modified Orthorhombic/$P2_1$cn |
| Ex 2 | $(Sr_{0.5}Ca_{0.5})_2(SiO_4)_{0.9}(ZrO_4)_{0.1}$: Eu, Cl | 536 | 159 | 0.385 | 0.506 | 83 | Modified Orthorhombic/$P2_1$cn |
| Ex 3 | $(Sr_{0.5}Ca_{0.5})_2(SiO_4)_{0.9}(HfO_4)_{0.1}$: Eu, Cl | 534 | 149 | 0.367 | 0.509 | 94 | Modified Orthorhombic/$P2_1$cn |
| Ex 4 | $(Sr_{0.5}Ca_{0.5})_2SiO_4$: Eu, Pr, Li, Cl, Br | 564 | 166 | 0.407 | 0.504 | 128 | |
| Ex 5 | $(Sr_{0.8}Ca_{0.2})_2SiO_4$: Eu, Pr, Cl, I | 596 | 111 | 0.491 | 0.487 | 107 | Orthorhombic/Pmnb |
| Ex 6 | $(Sr_{0.5}Ca_{0.5})_2SiO_4$: Eu, Yb, Cl | 539 | 154 | 0.383 | 0.510 | 105 | Modified Orthorhombic/$P2_1$cn |
| Ex 7 | $(Sr_{0.5}Ca_{0.5})_2SiO_4$: Eu, La, Cl | 532 | 131 | 0.355 | 0.520 | 85 | Modified Orthorhombic/$P2_1$cn |
| Ex 8 | $(Sr_{0.5}Ca_{0.5})_2SiO_4$: Eu, Dy, Cl | 542 | 160 | 0.394 | 0.508 | 115 | |
| Ex 9 | $(Sr_{0.5}Ca_{0.5})_2SiO_4$: Eu, Tm, Li | 541 | 156 | 0.383 | 0.509 | 110 | |
| Ex 10 | $(Sr_{0.5}Ca_{0.5})_2SiO_4$: Eu, Tb, Li | 542 | 155 | 0.383 | 0.509 | 114 | |
| Ex 11 | $(Sr_{0.9}Ca_{0.1})_2SiO_4$: Eu, Pr, Cl, I | 579 | 103 | 0.477 | 0.501 | 95 | Modified Orthorhombic/Pmnb |

Example 12

A glass tube reactor with a fritted disk bottom was heated to 150-250° C. The reactor contained a charge of 50 g of a phosphor of this invention. Nitrogen gas injection through the porous glass frit was controlled with a flow meter and the phosphor was allowed to heat up completely. The nitrogen through the bottom frit was then allowed to bubble through a water bubbler. A reactant gas mixture composed of nitrogen bubbled through $Al(CH_3)_3$ was then provided into the fluidized phosphor. The flows continued for 3-5 hours to form the first layer of coating. The coated phosphor particles were heated again to 150-250° C. When heat-up was complete the

TABLE 2

| | | Chromaticity | | |
|---|---|---|---|---|
| Device ID | CRI | x | y | CCT, Kelvin |
| Cv201-b | 93.3 | 0.36 | 0.41 | 6084 |
| Cv201-c | 92.4 | 0.37 | 0.41 | 5174 |

We claim:

1. A phosphor of formula I:

$$M_2(SiO_4)_{1-x-y-z}(TiO_4)_x(ZrO_4)_y(HfO_4)_z:A,S$$

wherein M is one or more divalent metal ions; A is one or more activators; S is one or more co-activators; and $0<x, y, z<1$ and $x+y+z<1$.

2. The phosphor of claim 1, wherein the phosphor is encapsulated with at least one layer of a coating comprising at least one product of hydrolysis of a metal or semiconductor alkoxide, metal alkyl, or metal or semiconductor tetrachloride.

3. The phosphor of claim 2, wherein the phosphor maintains at least about 80% of its original optical performance after exposure for about 2000 hours to a temperature of about 85° C. and a relative humidity of about 85%.

4. The phosphor of claim 2, wherein the product of hydrolysis of a metal or semiconductor alkoxide, metal alkyl, or metal or semiconductor tetrachloride is selected from the group consisting of titanium oxide, aluminum oxide, zirconium oxide, tin oxide, boron oxide, silicon oxide, zinc oxide, germanium oxide, tantalum oxide, niobium oxide, hafnium oxide, gallium oxide, aluminum silicate and combinations thereof.

5. The phosphor of claim 2, wherein the coating has a thickness of from about 0.005 microns to about 3.0 microns.

6. The phosphor of claim 1, wherein M is selected from the group consisting of $Mg^{2+}$, $Ca^{2+}$, $Sr^{2+}$, $Ba^{2+}$, $Zn^{2+}$, $Cd^{2+}$ and combinations thereof.

7. The phosphor of claim 1, wherein A is selected from the group consisting of divalent rare earth metal ions, trivalent metal ions and mixtures thereof.

8. The phosphor of claim 7, wherein A is a divalent rare earth metal ion selected from the group consisting of $Eu^{2+}$ and $Yb^{2+}$ and mixtures thereof.

9. The phosphor of claim 7, wherein A is a trivalent metal ion selected from the group consisting of $Bi^{3+}$, $Al^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ and $Lu^{3+}$ and mixtures thereof.

10. The phosphor of claim 1, wherein S is selected from the group consisting of monovalent metal ion, halogen ions and mixtures thereof.

11. The phosphor of claim 9, wherein S is a monovalent metal ion selected from the group consisting of $Li^+$, $Na^+$, $K^+$, $Rb^+$, $Cu^+$, $Ag^+$ and mixtures thereof.

12. The phosphor of claim 10, wherein S is a halogen ion selected from the group consisting of $F^-$, $Cl^-$, $Br^-$, $I^-$ and mixtures thereof.

13. The phosphor of claim 1, wherein the phosphor has a formula selected from the group consisting of:

a. $(Ca_xSr_{1-x})_2(SiO_4):Ce^{3+}, Eu^{2+}, H^-$, wherein $H^-$, is one or more halogen ions;

b. $(Ca_xSr_{1-x})_2(SiO_4): Eu^{2+}, Pr^{3+}, A$, wherein A is one or more monovalent ions;

c. $(Ca_xSr_{1-x})_2(SiO_4):Eu^{2+}, Dy^{3+}, H^-$, wherein $H^-$ is one or more halogen ions;

d. $(Ca_xSr_{1-x})_2(SiO_4):Eu^{2+}, Yb^{2+}, H^-$, wherein $H^-$ is one or more halogen ions;

e. $(Ca_xSr_{1-x})_2(SiO_4)_{1-x-y}(ZrO_4)_y:Eu^{2+}, H^-$, wherein $H^-$ is one or more halogen ions; and f. $(Ca_xSr_{1-x})_2(SiO_4)_{1-x-z}(HfO_4)_z:Eu^{2+}, H^-$, wherein $H^-$ is one or more halogen ions.

14. The phosphor of claim 13, wherein the phosphor has a formula of $(Ca_xSr_{1-x})_2(SiO_4):Ce^{3+}, Eu^{2+}, H^-$, wherein $H^-$ is one or more halogen ions.

15. The phosphor of claim 14, wherein the phosphor has a formula selected from the group consisting of:

g. $(Ca_xSr_{1-x})_2(SiO_4):Ce^{3+}, Eu^{2+}, Li^+$;
h. $(Ca_xSr_{1-x})_2(SiO_4):Ce^{3+}, Eu^{2+}, Cl^-$;
i. $(Ca_xSr_{1-x})_2(SiO_4):Ce^{3+}, Eu^{2+}, Br^-$;
j. $(Ca_xSr_{1-x})_2(SiO_4):Ce^{3+}, Eu^{2+}, I^-$;
k. $(Ca_xSr_{1-x})_2(SiO_4):Ce^{3+}, Eu^{2+}, (Cl^-, I^-)$;
l. $(Ca_xSr_{1-x})_2(SiO_4):Ce^{3+}, Eu^{2+}, (Cl^-, Br^-$; and
m. $(Ca_xSr_{1-x})_2(SiO_4):Ce^{3+}, Eu^{2+}, (Br^-, I^-)$.

16. The phosphor of claim 13, wherein the phosphor has a formula of $(Ca_xSr_{1-x})_2(SiO_4):Eu^{2+}, Pr^{3+}, A$, wherein A is one or more monovalent ions.

17. The phosphor of claim 16, wherein the phosphor has a formula selected from the group consisting of:

n. $(Ca_xSr_{1-x})_2(SiO_4):Eu^{2+}, Pr^{3+}, Li^+$;
o. $(Ca_xSr_{1-x})_2(SiO_4):Eu^{2+}, Pr^{3+}, Cl^-$;
p. $(Ca_xSr_{1-x})_2(SiO_4):Eu^{2+}, Pr^{3+}, Br^-$;
q. $(Ca_xSr_{1-x})_2(SiO_4):Eu^{2+}, Pr^{3+}, I^-$;
r. $(Ca_xSr_{1-x})_2(SiO_4):Eu^{2+}, Pr^{3+}, (Cl^-, I^-)$;
s. $(Ca_xSr_{1-x})_2(SiO_4):Eu^{2+}, Pr^{3+}, (Cl^-, Br^-)$; and
t. $(Ca_xSr_{1-x})_2(SiO_4):Eu^{2+}, Pr^{3+}, (Br^-, I^-)$.

18. The phosphor of claim 1, wherein the phosphor has a band emission of greater than about 120 nm.

19. The phosphor of claim 1, wherein the phosphor emits light in a wavelength of from about 500 nm to about 600 nm.

* * * * *

UNITED STATES PATENT AND TRADEMARK OFFICE
CERTIFICATE OF CORRECTION

PATENT NO. : 8,242,525 B2
APPLICATION NO. : 12/469522
DATED : August 14, 2012
INVENTOR(S) : Yongchi Tian et al.

Page 1 of 1

It is certified that error appears in the above-identified patent and that said Letters Patent is hereby corrected as shown below:

In the Specifications:

In Col. 1, after the title and before "CLAIM OF PRIORITY", please insert:

--REFERENCE TO GOVERNMENT RIGHTS

This invention was made with United States Government support under ATP Award No. 70NANB7H7042 awarded by the National Institute of Standards and Technology (NIST). The United States Government has certain rights in the invention.--

Signed and Sealed this
Thirteenth Day of August, 2013

Teresa Stanek Rea
*Acting Director of the United States Patent and Trademark Office*